United States Patent
Kubota et al.

(10) Patent No.: US 9,105,857 B2
(45) Date of Patent: Aug. 11, 2015

(54) ORGANIC ELECTROLUMINESCENT ELEMENT, LIGHTING FIXTURE, AND FOOD STORAGE DEVICE

(75) Inventors: Hirofumi Kubota, Osaka (JP); Varutt Kittichungchit, Osaka (JP); Hiroya Tsuji, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 28 days.

(21) Appl. No.: 14/006,437

(22) PCT Filed: Mar. 13, 2012

(86) PCT No.: PCT/JP2012/056357
§ 371 (c)(1),
(2), (4) Date: Sep. 20, 2013

(87) PCT Pub. No.: WO2012/128117
PCT Pub. Date: Sep. 27, 2012

(65) Prior Publication Data
US 2014/0022769 A1   Jan. 23, 2014

(30) Foreign Application Priority Data
Mar. 24, 2011   (JP) .................................. 2011-066561

(51) Int. Cl.
*H01L 51/52* (2006.01)
*F21W 131/305* (2006.01)
(Continued)

(52) U.S. Cl.
CPC .......... *H01L 51/504* (2013.01); *F21V 33/0024* (2013.01); *H01L 51/5044* (2013.01); *F21W 2131/305* (2013.01); *H01L 2251/5361* (2013.01)

(58) Field of Classification Search
CPC ........... A47F 3/00; A47F 3/001; F25D 27/00; F21W 2131/305; F21W 2131/405; H01L 51/5036–51/5044
USPC ................... 313/504; 362/126, 154; 428/690; 252/301.16
See application file for complete search history.

(56) References Cited

U.S. PATENT DOCUMENTS 6,528,188 B1   3/2003 Suzuki et al.
2003/0170491 A1*  9/2003 Liao et al. ..................... 428/690
(Continued)

FOREIGN PATENT DOCUMENTS

JP   2001-155860   6/2001
JP   3589960   11/2004
(Continued)

OTHER PUBLICATIONS
Machine translation of JP 2008-295534A, retrieved Dec. 11, 2014.*
(Continued)

*Primary Examiner* — Anh Mai
*Assistant Examiner* — Steven Horikoshi
(74) *Attorney, Agent, or Firm* — Greenblum & Bernstein, P.L.C.

(57) ABSTRACT

The object of the present invention is to provide an organic electroluminescent element suitable for both food lighting at a high temperature and indoor lighting at room temperature. The organic electroluminescent element according to the present invention has such characteristics that: an element temperature at which a general color rendering index Ra has its maximum in an element temperature range of 5° C. to 60° C. is present in a range of 15° C. to 35° C.; and an element temperature at which at least one of a color rendering index R8 a special color rendering index R9, a special color rendering index R14, and a special color rendering index R15 has its maximum in the element temperature range of 5° C. to 60° C. is in a range of temperatures higher than the element temperature at which the general color rendering index Ra has its maximum.

20 Claims, 9 Drawing Sheets

(51) Int. Cl.
*H01L 51/50* (2006.01)
*F21V 33/00* (2006.01)

(56) References Cited

U.S. PATENT DOCUMENTS

| | | | | |
|---|---|---|---|---|
| 2005/0100760 A1* | 5/2005 | Yokoyama | | 428/690 |
| 2009/0045736 A1* | 2/2009 | Kho et al. | | 313/504 |
| 2009/0243467 A1* | 10/2009 | Shimizu et al. | | 313/503 |

FOREIGN PATENT DOCUMENTS

| | | |
|---|---|---|
| JP | 2007-309631 | 11/2007 |
| JP | 2008-288396 | 11/2008 |
| JP | 2008-295534 | 12/2008 |
| JP | 2008295534 A * | 12/2008 |
| JP | 2009-224274 | 10/2009 |
| JP | 2010-129301 | 6/2010 |

OTHER PUBLICATIONS

Iwashita et al., "Making Lighting Device Using Organic Light Emitting Diodes", The Journal of the Institute of Image Information and Television Engineers, vol. 64, No. 9, Sep. 1, 2010, pp. 1323-1326, together with a partial English language translation thereof.

Ide et al., "White OLED devices and processes for lighting applications", Proceedings of SPIE, vol. 7722, 2010, pp. 772202.1-772202.8.

International Search Report in PCT/JP2012/056357, mail date is , mail date is Apr. 17, 2012.

* cited by examiner

ORGANIC ELECTROLUMINESCENT ELEMENT, LIGHTING FIXTURE, AND FOOD STORAGE DEVICE

TECHNICAL FIELD

The present invention relates to an organic electroluminescent element, a lighting fixture including the organic electroluminescent element, and a food storage device including the lighting fixture.

BACKGROUND ART

Organic electroluminescent elements (organic light emitting diodes) are attracting intention as next-generation light sources that can be utilized as flat panel displays, backlights for liquid crystal display devices, light sources for lighting and the like, because of reasons such as being capable of surface emission at high luminance with a low voltage.

Patent Literature 1 discloses one example of conventional organic electroluminescent elements. In this organic electroluminescent element, a light emitting layer is constituted by a hole transporting light emitting layer in which a hole transporting material to which a first fluorescent material is added serves as a matrix, and an electron transporting light emitting layer in which an electron transporting material to which a second fluorescent material is added serves as a matrix. The hole transporting light emitting layer and the electron transporting light emitting layer are caused to emit light at the same time so that the color of light emitted from these light emitting layers is perceived as a mixed color, and both first fluorescent material of the hole transporting light emitting layer and second fluorescent material of the electron transporting light emitting layer are respectively made of two or more types of fluorescent materials such that the emission spectrum of light with a color emitted from the hole transporting light emitting layer is approximately the same as that of light with a color emitted from the electron transporting light emitting layer. The wavelengths of the peak in fluorescence of these two or more types of fluorescent material in a solid state are different from each other. The organic electroluminescent element disclosed in Patent Literature 1 is proposed from the point of view of preventing a chromaticity change in the color of emitted light that accompanies a change in the amount of applied current or the elapse of emission time.

CITATION LIST

Patent Literature

Patent Literature 1: JP 3589960 B

SUMMARY OF INVENTION

Technical Problem

However, the present inventors newly focused on and investigated the relationship between the temperature environment where a lighting fixture is used and the object to be illuminated therewith, which is a matter that has not been sufficiently investigated up to now, when organic electroluminescent elements are applied to lighting uses.

For example, in order to display or store food, cooked dishes or the like at a store, a food storage device such as a showcase or the like that is capable of storing food etc. at a high temperature around 60° C. is used for the purpose of suppressing bacteria growth and preventing food poisoning. A light source having a high specific special color rendering index is used as lighting in this food storage device in order to enhance the appearance of food and the like that are for sale. On the other hand, a light source having a high general color rendering index is preferred for indoor lighting.

Conventionally, a fluorescent lamp has been mainly used as such a light source. However, a fluorescent lamp has a narrow width of an emission spectrum, and therefore it is difficult to obtain various color rendering properties. Accordingly, fluorescent lamps having different color rendering properties have been developed for lighting use in a food storage device and indoor lighting use. Thus, there is a problem in that it is difficult to reduce the cost of light sources. Furthermore, since the value of the general color rendering index of a fluorescent lamp is low at about 80, it has not been possible to sufficiently improve the appearance of a lighting target in lighting use in a food storage device or indoor lighting use.

In view of this, if it is possible to obtain an organic electroluminescent element that has both color rendering properties capable of improving the appearance of food at a high temperature and a high general color rendering index at room temperature, the need to change the design of the organic electroluminescent element in accordance with the purpose of lighting is eliminated. Accordingly, it is possible to obtain highly versatile organic electroluminescent elements at low cost. Organic electroluminescent elements designed from such a point of view have not yet existed.

The present invention has been made in light of the above-described circumstances, and it is an object of the present invention to provide an organic electroluminescent element and a lighting fixture that are suitable for both food lighting at a high temperature and indoor lighting at room temperature, and to provide a food storage device that includes the lighting fixture and is capable of storing food at a high temperature and enhancing the appearance of the food.

Solution to Problem

The organic electroluminescent element in accordance with the present invention has such characteristics that: an element temperature at which a general color rendering index Ra has its maximum in an element temperature range of 5° C. to 60° C. is present in a range of 15° C. to 35° C.; and an element temperature at which at least one of a color rendering index R8 a special color rendering index R9, a special color rendering index R14, and a special color rendering index R15 has its maximum in the element temperature range of 5° C. to 60° C. is in a range of temperatures higher than the element temperature at which the general color rendering index Ra has its maximum.

In a preferred aspect of the organic electroluminescent element in accordance with the present invention, in the element temperature range to 60° C. from the element temperature at which the general rendering index Ra has its maximum, at least one of the color rendering index R8, the special color rendering index R9, the special color rendering index R14, and the special color rendering index R15 increases with an increase in the element temperature.

In a preferred aspect of the organic electroluminescent element in accordance with the present invention, in the element temperature range to 60° C. from the element temperature at which the general rendering index Ra has its maximum, at least one of the color rendering index R8 and the special color rendering index R9 increases with an increase in the element temperature.

In a preferred aspect of the organic electroluminescent element in accordance with the present invention, a value of the special color rendering index R9 at the element temperature of 60° C. is in a range of 1.2 to 1.9 times a value of the special rendering index R9 at the element temperature of 25° C.

In a preferred aspect of the organic electroluminescent element in accordance with the present invention, the element temperature at which at least one of the special color rendering indexes R14 and R15 has its maximum in the element temperature range of 5° C. to 60° C. falls within a range of 40° C. to 60° C.

In a preferred aspect of the organic electroluminescent element in accordance with the present invention, with regard to values of u' and v' in a u', v' chromaticity diagram (CIE 1976 UCS chromaticity diagram) of a color of light emitted from the organic electroluminescent element in a direction identical to a direction in which multiple layers constituting the organic electroluminescent element are stacked, the value of u' increases more and the value of v' decreases more in a case where the element temperature is 60° C. than in a case where the element temperature is 25° C.

In a preferred aspect of the organic electroluminescent element in accordance with the present invention, a color temperature of light is lower in a case where the element temperature is 60° C. than in a case where the element temperature is 25° C.

In a preferred aspect of the organic electroluminescent element in accordance with the present invention, an applied voltage necessary for allowing current densities at the element temperatures of 60° C. and 25° C. to have the same value is lower in a case where the element temperature is 60° C. than in a case where the element temperature is 25° C.

In a preferred aspect of the organic electroluminescent element in accordance with the present invention, with regard to the element temperature range of 0° C. to 60° C., at least one of the special color rendering index R8, the special color rendering index R9, the special color rendering index R14, and the special color rendering index R15 has its maximum in a range of the element temperature of 10° C. to 30°.

Moreover, in a preferred aspect of the organic electroluminescent element in accordance with the present invention, in the element temperature range of 0° C. to 30° C., at least one of the general color rendering index Ra, the special color rendering index R8, the special color rendering index R14, and the special color rendering index R15 satisfies a condition that a proportion of its minimum to its maximum is equal to 0.8 or more and a value thereof is equal to 70 or more.

Moreover, in a preferred aspect of the organic electroluminescent element in accordance with the present invention, in the element temperature range of 0° C. to 30° C., the special color rendering index R9 has a proportion of its minimum to its maximum that is equal to 0.75 or more, and has its value that is equal to 40 or more.

Moreover, in a preferred aspect of the organic electroluminescent element in accordance with the present invention, with regard to values of u' and v' in a u', v' chromaticity diagram of a color of light emitted from the organic electroluminescent element in a direction identical to a direction in which multiple layers constituting the organic electroluminescent element are stacked, the values of u' and v' are greater in a case where the element temperature is 0° C. than in a case where the element temperature is 25° C.

Further, in a preferred aspect of the organic electroluminescent element in accordance with the present invention, a color temperature of light is lower in a case where the element temperature is 5° C. than in a case where the element temperature is 25° C.

In a preferred aspect of the organic electroluminescent element in accordance with the present invention, the organic electroluminescent element includes a plurality of light emitting layers designed to emit light in a green region. At least one of the plurality of light emitting layers contains a phosphorescent dopant.

In a preferred aspect of the organic electroluminescent element in accordance with the present invention, the organic electroluminescent element includes a red region light emitting layer designed to emit light in a red region, and a green region light emitting layer designed to emit light in a green region. The green region light emitting layer is placed on the red region light emitting layer and contains a phosphorescent dopant. The red region light emitting layer has a thickness less than a thickness of the green region light emitting layer.

In a preferred aspect of the organic electroluminescent element in accordance with the present invention, a rate of the thickness of the red region light emitting layer to the thickness of the green region light emitting layer is in a range of 2 to 15%.

In a preferred aspect of the organic electroluminescent element in accordance with the present invention, the organic electroluminescent element includes a first light emitting unit, a second light emitting unit, and an interlayer interposed between the first light emitting unit and the second light emitting unit.

The lighting fixture in accordance with the present invention includes the organic electroluminescent element.

The food storage device in accordance with the present invention includes a storage configured to store food and the lighting fixture configured to illuminate an interior of the storage.

Advantageous Effects of Invention

According to the present invention, it is possible to obtain an organic electroluminescent element and a lighting fixture that are suitable for both food lighting at a high temperature and indoor lighting at room temperature.

Also, according to the present invention, it is possible to obtain a food storage device that includes the lighting fixture and is capable of storing food at a high temperature and enhancing the appearance of the food.

DESCRIPTION OF EMBODIMENTS

Figure 1:
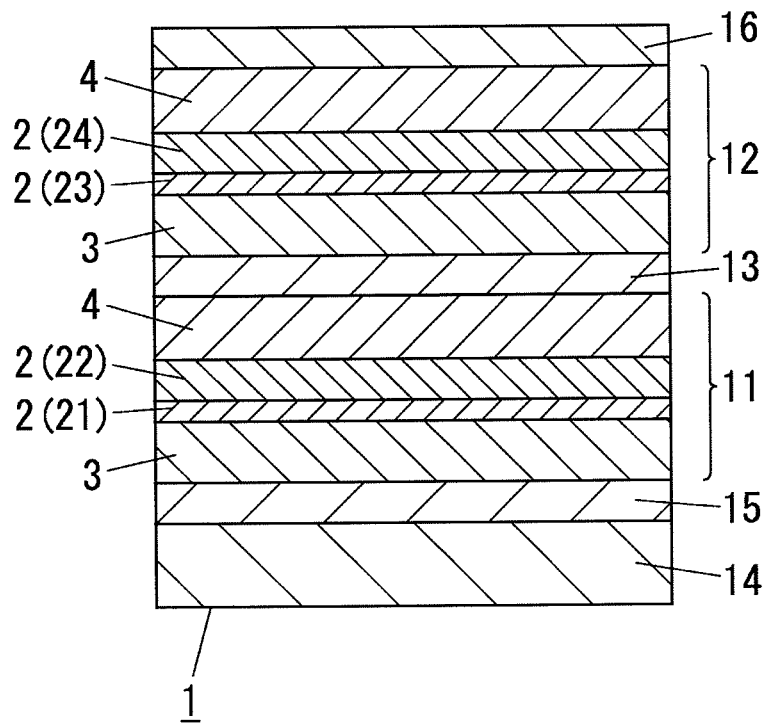
FIG. 1 is a cross-sectional view schematically showing the layer structure of an organic electroluminescent element in an embodiment of the present invention.

FIG. 1 schematically shows one example of the structure of the organic electroluminescent element (organic light emitting diode) in the present embodiment. The organic electroluminescent element 1 is defined as a multi-unit element including a first light emitting unit 11, a second light emitting unit 12, and an interlayer 13 interposed between the first light emitting unit 11 and the second light emitting unit 12.

The organic electroluminescent element 1 has a structure in which a substrate 14, a first electrode 15, the first light emitting unit 11, the interlayer 13, the second light emitting unit 12, and a second electrode 16 are stacked in this order.

It is preferable that the substrate 14 is light transmissive (transparent or translucent). The substrate 14 may be colorless and transparent or slightly colored. The substrate 14 may have a frosted glass appearance.

Examples of material for the substrate 14 include transparent glass such as soda-lime glass and alkali-free glass; and plastic such as polyester resin, polyolefin resin, polyamide resin, epoxy resin, and fluorine-based resin. The shape of the substrate 14 may be a film-like shape or a plate-like shape.

It also is preferable that the substrate 14 has a light diffusion effect. Examples of the structure of this substrate 14 include a structure that includes a matrix phase and particles, a powder, bubbles, or the like that are dispersed in this matrix phase and have a different refractive index from that of the matrix phase; a structure in which shaping processing for improving light diffusion is performed on the surface; and a structure in which a light scattering film or microlens film is placed on the surface of a substrate in order to improve light diffusion.

In the case where it is not necessary for the substrate 14 to transmit light emitted from the organic electroluminescent element 1, the substrate 14 does not need to be light transmissive. In this case, there is no particular limitation on the material for the substrate 14 as long as the element does not lose emission properties, lifetime characteristics, and the like. However, it is preferable that the substrate 14 is formed of a material having high thermal conductivity, such as a metal foil made of aluminum, from the point of view of suppressing a temperature increase in the element.

The first electrode 15 functions as an anode. The anode of the organic electroluminescent element 1 is the electrode for injecting holes into a light emitting layer 2. It is preferable that the first electrode 15 is formed of a material such as a metal, alloy, or electrically conductive compound that has a large work function, or a mixture thereof. Particularly, it is preferable that the first electrode 15 is formed of a material having a work function of 4 eV or greater. In other words, it is preferable that the work function of the first electrode 15 is greater than or equal to 4 eV. Examples of a material for forming this first electrode 15 include metal oxides such as ITO (indium-tin oxide), $SnO_2$, ZnO, and IZO (indium-zinc oxide). The first electrode 15 can be formed with an appropriate method such as vacuum vapor deposition, sputtering, or coating, using these materials. In the case where the first electrode 15 is to transmit light emitted from the organic electroluminescent element 1, it is preferable that the light transmittance of the first electrode 15 is greater than or equal to 70%, and it is more preferable that it is greater than or equal to 90%. Furthermore, it is preferable that the sheet resistance of the first electrode 15 is less than or equal to several hundred Ω/□, and it is particularly preferable that it is less than or equal to 100Ω/□. The thickness of the first electrode 15 is appropriately selected such that properties such as the light transmittance and sheet resistance of the first electrode 15 are approximately desired values. Although the favorable thickness of the first electrode 15 changes depending on the material constituting the first electrode 15, the thickness of the first electrode 15 may be selected to less than or equal to 500 nm, and preferably selected in the range of 10 nm to 200 nm.

It is preferable that a hole injection layer is placed on the first electrode 15 in order to inject holes from the first electrode 15 into the light emitting layer 2 at a lowered voltage. Examples of the material for forming the hole injection layer include a conductive polymer such as PEDOT/PSS or polyaniline, a conductive polymer that is doped with any acceptor or the like, and a material having conductivity and a light transmissive property such as carbon nanotubes, CuPc (copper phthalocyanine), MTDATA[4,4',4"-Tris(3-methyl-phenylphenylamino)tri-phenylamine], TiOPC (titanyl phthalocyanine), and amorphous carbon. In the case where the hole injection layer is formed of a conductive polymer, for example, the conductive polymer is processed into an ink form, and then it is formed into a film with a method such as a coating or printing to form the hole injection layer. In the case where the hole injection layer is formed of a low molecular organic material or an inorganic substance, for example, the hole injection layer is formed with a vacuum vapor deposition method or the like.

The second electrode 16 functions as a cathode. The cathode of the organic electroluminescent element 1 is the electrode for injecting electrons into the light emitting layer 2. It is preferable that the second electrode 16 is formed of a material such as a metal, alloy, or electrically conductive compound that has a small work function, or a mixture thereof. Particularly, it is preferable that the second electrode 16 is formed of a material having a work function of 5 eV or less. In other words, it is preferable that the work function of the second electrode 16 is less than or equal to 5 eV. Examples of a material for forming such a second electrode 16 include Al, Ag, and MgAg. The second electrode 16 can be formed of an Al/$Al_2O_3$ mixture or the like. In the case where the second electrode 16 is to transmit light emitted from the organic electroluminescent element 1, it is preferable that the second electrode 16 is constituted by multiple layers, and a portion of the multiple layers are formed of a transparent conductive material typified by ITO, IZO, and the like. The second electrode 16 can be formed with an appropriate method such as vacuum vapor deposition or sputtering, using these materials. In the case where the first electrode 15 is to transmit light emitted from the organic electroluminescent element 1, it is preferable that the light transmittance of the second electrode 16 is 10% or less. However, in the case where the second electrode 16 is to transmit light emitted from the organic electroluminescent element 1, it is preferable that the light transmittance of the second electrode 16 is 70% or more. The thickness of the second electrode 16 is appropriately selected such that properties such as the light transmittance and sheet resistance of the second electrode 16 are approximately desired values. Although the favorable thickness of the second electrode 16 changes depending on the material constituting the second electrode 16, the thickness of the second electrode 16 may be selected to less than or equal to 500 nm, and preferably selected in the range of 20 nm to 200 nm.

It is preferable that an electron injection layer is placed on the second electrode 16 in order to inject electrons from the second electrode 16 into the light emitting layer 2 at a lowered voltage. Instances of the material for forming the electron injection layer include an alkali metal, alkali metal halides, alkali metal oxides, alkali metal carbonates, an alkaline earth metal, and an alloy including these metals. Specific instances thereof include sodium, a sodium-potassium alloy, lithium, lithium fluoride, $Li_2O$, $Li_2CO_3$, magnesium, MgO, a magnesium-indium mixture, an aluminum-lithium alloy, and an Al/LiF mixture. The electron injection layer can be formed by an organic layer that is doped with an alkali metal such as lithium, sodium, cesium, or calcium, an alkaline earth metal, or the like.

The first light emitting unit 11 includes the light emitting layer 2. The first light emitting unit 11 may further include a hole transport layer 3, an electron transport layer 4, etc. as necessary. The second light emitting unit 12 also includes a light emitting layer 2. The second light emitting unit 12 may also further include a hole transport layer 3, an electron transport layer 4, etc. as necessary. Each light emitting unit has a layered structure of, for instance, the hole transport layer 3/one or more light emitting layers 2/the electron transport layer 4.

In this aspect, the first light emitting unit 11 includes, as the light emitting layers 2, a blue region light emitting layer 21 and a green region light emitting layer 22 (a first green region light emitting layer 22) producing fluorescence. The blue region light emitting layer 21 serves as the light emitting layer 2 designed to emit blue light, and the first green region light emitting layer 22 serves as the light emitting layer 2 designed to emit green light. On the other hand, the second light emitting unit 12 includes, as the light emitting layers 2, a red region light emitting layer 23 and a green region light emitting layer 24 (a second green region light emitting layer 24) exhibiting phosphorescence. The red region light emitting layer 23 serves as the light emitting layer 2 designed to emit red light, and the second green region light emitting layer 24 serves as the light emitting layer 2 designed to emit green light.

Each light emitting layer 2 can be formed of an organic material (host material) that is doped with a luminescent organic substance (dopant).

Any material selected from an electron transporting material, a hole transporting material, and an electron transporting and hole transporting material can be used as the host material. The electron transporting material and the hole transporting material may be used together with each other as the host material. The host material may be formed so as to have a concentration gradient inside the light emitting layer 2. For instance, the light emitting layer 2 may be formed such that the concentration of the hole transporting material increases as the distance from the first electrode 15 decreases inside the light emitting layer 2, and the concentration of the electron transporting material increases as the distance from the second electrode 16 decreases. There is no particular limitation on the electron transporting material and the hole transporting material that are used as the host material. For instance, the hole transporting material can be appropriately selected from materials that can constitute the hole transport layer 3 described later. Moreover, the electron transporting material can be appropriately selected from materials that can constitute the electron transport layer 4 described later.

Instances of the host material constituting the first green region light emitting layer 22 include Alq3 (tris(8-oxoquinoline) aluminum (III)), ADN, and BDAF. Instances of the fluorescent dopant in the first green region light emitting layer 22 include C545T (coumarineC545T; 10-2-(benzothiazolyl)-2,3,6,7-tetrahydro-1,1,7,7-tetramethyl-1H,5H,11H-(1)benzopyro pyrano(6,7,-8-ij)quinolizine-11-one)), DMQA, coumarin6, and rubrene. It is preferable that the concentration of the dopant in the first green region light emitting layer 22 is in the range of 1 to 20% by mass.

Instances of the host material constituting the second green region light emitting layer 24 include CBP, CzTT, TCTA, mCP, and CDBP. Instances of the phosphorescent dopant in the second green region light emitting layer 24 include Ir(ppy)s (fac-tris)(2-phenylpyridine)iridium), $Ir(ppy)_2(acac)$, and $Ir(mppy)_3$. It is preferable that the concentration of the dopant in the second green region light emitting layer 24 is in the range of 1 to 40% by mass.

Instances of the host material constituting the red region light emitting layer 23 include CBP(4,4'-N,N'-dicarbazole biphenyl), CzTT, TCTA, mCP, and CDBP. Instances of the dopant in the red region light emitting layer 23 include $Btp_2Ir$(acac)(bis-(3-(2-(2-pyridyl)benzothienyl)mono-acetylacetonate)iridium (III)), $Bt_2Ir(acac)$, and PtOEP. It is preferable that the concentration of the dopant in the red region light emitting layer 23 is in the range of 1 to 40% by mass.

Instances of the host material constituting the blue region light emitting layer 21 include TBADN(2-t-butyl-9,10-di(2-naphthyl)anthracene), ADN, and BDAF. Instances of the dopant in the blue region light emitting layer 21 include TBP(1-tert-butyl-perylene), BCzVBi, and perylene. Instances of a charge transfer promoting dopant include NPD (4,4'-bis[N-(naphthyl)-N-phenyl-amino]biphenyl), TPD(N, N'-bis(3-methylphenyl)-(1,1'-biphenyl)-4,4'-diamine), and Spiro-TAD. It is preferable that the concentration of the dopant in the blue region light emitting layer 21 is in the range of 1 to 30% by mass.

Each light emitting layer 2 can be formed with an appropriate method, instances of which include a dry process such as vacuum vapor deposition or transfer, and a wet process such as spin coating, spray coating, dye coating, or gravure printing.

The material constituting the hole transport layer 3 (hole transporting material) is appropriately selected from a group of compounds having a hole transporting property. It is preferable that the hole transporting material is a compound that has a property of donating electrons and is stable when undergoing radical cationization due to electron donation. Instances of the hole transporting material include: triarylamine-based compounds, amine compounds containing a carbazole group, amine compounds containing fluorene derivatives, and starburst amines (m-MTDATA), representative instances of which include polyaniline, 4,4'-bis[N-(naphthyl)-N-phenyl-amino]biphenyl ($\alpha$-NPD), N,N'-bis(3-methylphenyl)-(1,1'-biphenyl)-4,4'-diamine (TPD), 2-TNATA, 4,4'-4"-tris(N-(3-methylphenyl)N-phenylamino)triphenylamine (MTDATA), 4,4'-N,N'-dicarbazole biphenyl (CBP), spiro-NPD, spiro-TPD, spiro-TAD, and TNB; and 1-TMATA, 2-TNATA, p-PMTDATA, TFATA or the like as a TDATA-based material, but instances thereof are not limited to these, and any hole transport material that is generally known is used. The hole transport layer 3 can be formed with an appropriate method such as vapor deposition.

It is preferable that the material for forming the electron transport layer 4 (electron transporting material) is a compound that has the ability to transport electrons, can accept electrons injected from the second electrode 16, and produces excellent electron injection effects on the light emitting layer 2, and moreover, prevents the movement of holes to the electron transport layer 4 and is excellent in terms of thin film formability. Instances of the electron transporting material include Alq3, oxadiazole derivatives, starburst oxadiazole, triazole derivatives, phenylquinoxaline derivatives, and silole derivatives. Specific instances of the electron transporting material include fluorene, bathophenanthroline, bathocuproine, anthraquinodimethane, diphenoquinone, oxazole, oxadiazole, triazole, imidazole, anthraquinodimethane, 4,4'-N,N'-dicarbazole biphenyl (CBP), etc., and compounds thereof, metal-complex compounds, and nitrogen-containing five-membered ring derivatives. Specifically, instances of metal-complex compounds include tris(8-hydroxyquinolinato)aluminum, tri(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato) zinc, bis(2-methyl-8-quinolinato)(o-cresolate)gallium, bis(2-methyl-8-quinolinato)(1-naphtholate)aluminum, and bis(2-methyl-8-quinolinato)-4-phenylphenolato, but are not limited thereto.

Preferable instances of nitrogen-containing five-membered ring derivatives include oxazole, thiazole, oxadiazole, thiadiazole, and triazole derivatives, and specific instances thereof include 2,5-bis(1-phenyl)-1,3,4-oxazole, 2,5-bis(1-phenyl)-1,3,4-thiazole, 2,5-bis(1-phenyl)-1,3,4-oxadiazole,
2-(4'-tert-butylphenyl)-5-(4"-biphenyl) 1,3,4-oxadiazole,
2,5-bis(1-naphthyl)-1,3,4-oxadiazole, 1,4-bis[2-(5-phenylthiadiazolyl)]benzene,
2,5-bis(1-naphthyl)-1,3,4-triazole, and
3-(4-biphenylyl)-4-phenyl-5-(4-t-butylphenyl)-1,2,4-triazole, but are not limited thereto. Instances of the electron transporting material include the polymer material used for the polymer organic electroluminescent element 1. Instances of this polymer material include polyparaphenylene and derivatives thereof, and fluorene and derivatives thereof. There is no particular limitation on the thickness of the electron transport layer 4, and for instance, it is formed to have a thickness in the range of 10 to 300 nm. The electron transport layer 4 can be formed with an appropriate method such as vapor deposition.

The interlayer 13 serves the function of electrically connecting two light emitting units in series. It is preferable that the interlayer 13 has high transparency and is highly thermally and electrically stable. The interlayer 13 can be formed of a layer that forms an equipotential surface, a charge generation layer, or the like. Instances of the material for a layer that forms an equipotential surface or charge generation layer include: a thin film of metal such as Ag, Au, or Al; metal oxides such as vanadium oxide, molybdenum oxide, rhenium oxide, and tungsten oxide: a transparent conductive film such as ITO, IZO, AZO, GZO, ATO, or $SnO_2$; a so-called laminate of an n-type semiconductor and a p-type semiconductor; a laminate of a metal thin film or transparent conductive film, and either one of or both an n-type semiconductor and a p-type semiconductor; a mixture of an n-type semiconductor and a p-type semiconductor; and a mixture of a metal and either one of or both an n-type semiconductor and a p-type semiconductor. There is no particular limitation on the n-type semiconductor and the p-type semiconductor, and any semiconductors selected as necessary are used. The n-type semiconductor and the p-type semiconductor may be formed of either an inorganic material or an organic material. The n-type semiconductor and the p-type semiconductor may be a mixture of an organic material and a metal; a combination of an organic material and a metal oxide; or a combination of an organic material and an organic acceptor/donor material or inorganic acceptor/donor material. The interlayer 13 can be formed of BCP:Li, ITO, NPD:$MoO_3$, Liq:Al, or the like. BCP represents 2,9-dimethyl-4,7-diphenyl-1,10-phenanthroline. For instance, the interlayer 13 can have a two-layered configuration obtained by disposing a first layer made of BCP:Li on the anode side, and a second layer made of ITO on the cathode side. It is preferable that the interlayer 13 has a layer structure such as Alq3/$Li_2$O/HAT-CN6, Alq3/$Li_2$O, or Alq3/$Li_2$O/Alq3/HAT-CN6.

The organic electroluminescent element 1 according to the present embodiment has such characteristics that, in the element temperature range of 5° C. or greater to 60° C. or less, the element temperature at which the general color rendering index Ra is the maximum is in the range of 15° C. or greater to 35° C. or less. Although room temperature is usually comfortable about 20° C. (referred to as standard room temperature), it fluctuates over a day and also fluctuates with the seasons. Since there are objects having various colors in a room, it is appropriate to discuss color rendering properties in indoor lighting using the general color rendering property. If the element temperature at which the general color rendering index Ra is the maximum is in the range of 15° C. or greater to 35° C. or less as in the present embodiment, in the case where the organic electroluminescent element 1 is applied to indoor lighting uses, there is a decrease in the absolute fluctuation range of color rendering properties from the morning during which the room temperature is low to the daytime during which the temperature increases. Accordingly, objects illuminated by light emitted from the organic electroluminescent element 1 look better. It is particularly preferable that the element temperature at which the general color rendering index Ra is the maximum is 25° C. or close thereto, taking into consideration the fact that the element temperature rises from room temperature due to heat generated at the time of being driven.

It is one object of the present embodiment to realize a high general color rendering index Ra at room temperature. However, the element temperature becomes higher than the environmental temperature due to heat generated as described above. For instance, in the case where the element temperature is higher than the environmental temperature by 5° C. and the temperature corresponding to room temperature is 10° C. to 30° C., the element temperature needs only be 15° C. to 35° C. Also, since the temperature at which people feel comfortable is about 20° C., it is further ideally desirable that the element temperature is 25° C.

Further, in the organic electroluminescent element 1 according to the present embodiment, the element temperature at which at least one of the color rendering index R8 (reddish purple), the special color rendering index R9 (red), the special color rendering index R14 (leaf), and the special color rendering index R15 (Japanese complexion) has its maximum in the element temperature range of 5° C. to 60° C. falls within a range including temperatures higher than the element temperature at which the general color rendering index Ra has its maximum. If the organic electroluminescent element 1 has such color rendering properties, foods (including cooked dishes) illuminated by light emitted from the organic electroluminescent element 1 look better at a high temperature.

[First Aspect]

In the first aspect of the organic electroluminescent element 1 according to the present invention, it is preferable that in the element temperature range to 60° C. from the element temperature at which the general rendering index Ra has its maximum, at least one of the color rendering index R8 (reddish purple), the special color rendering index R9 (red), the special color rendering index R14 (leaf), and the special color rendering index R15 (Japanese complexion) increases with an increase in the element temperature. If the organic electroluminescent element 1 has such color rendering properties, foods (including cooked dishes) illuminated by light emitted from the organic electroluminescent element 1 look still better at a high temperature.

The evaluation of color rendering properties using the color rendering indexes and special color rendering indexes where the organic electroluminescent element 1 is a light source is based on JIS Z8726.

The color rendering index R8 (reddish purple) and the special color rendering index R9 (red) affect the appearance of reddish foods such as meat and tomatoes. If the element temperature at which at least one of the color rendering index R8 (reddish purple) and the special color rendering index R9 (red) has its maximum is in a range including temperatures higher than the element temperature at which the general color rendering index Ra has its maximum, at least one value of the color rendering index R8 (reddish purple) and the special color rendering index R9 (red) increases in the temperature range of room temperature to 60° C. Accordingly, reddish foods illuminated by light emitted from the organic electroluminescent element 1 look better at a high temperature. Particularly, it is preferable that both the element temperature at which the color rendering index R8 (reddish purple) has its maximum and the element temperature at which the special color rendering index R9 (red) has its maximum are in a range including temperatures higher than the element temperature at which the general color rendering index Ra has its the maximum.

Furthermore, in the range of temperatures from 60° C. to the element temperature at which the general color rendering index Ra has its maximum, if at least one of the color rendering index R8 (reddish purple) and the special color rendering index R9 (red) increases with an increase in the element temperature, at least one value of the color rendering index R8 (reddish purple) and the special color rendering index R9 (red) is the highest at a high temperature (about 60° C.). Accordingly, the appearance of reddish foods is further improved. Particularly, it is preferable that both the color rendering index R8 (reddish purple) and the special color rendering index R9 (red) increase with an increase in the element temperature.

Furthermore, it is preferable that the value of the special color rendering index R9 at an element temperature of 60° C. is in the range of 1.2 to 1.9 times inclusive the value of the special color rendering index R9 in the case of an element temperature of 25° C. In this case, in the case of indoor lighting around 25° C., the reddish color of an object illuminated by light is not excessively emphasized, and reddish foods look better at a high temperature. For instance, it is preferable that R9 is about 50 at an element temperature of 25° C., and is about 70 at an element temperature of 60° C. The value of the special color rendering index R9 at an element temperature of 60° C. is 1.2 times or greater the value of the special color rendering index R9 in the case of an element temperature of 25° C., and thereby the reddish color of an object is sufficiently emphasized at a high temperature. Also, in the case where the general color rendering property at the time of indoor lighting is high (in particular, in the case of 90 or greater, and preferably 95 or greater), if R9 is too low, balance is lost, and therefore it is preferable that the value of the special color rendering index R9 at room temperature is about 50. In this case, since the maximum of the special color rendering properties is 100, it is preferable that the special color rendering index R9 at an element temperature of 60° C., which is for keeping the balance between the general color rendering index Ra and the special color rendering index R9 at the time of lighting at a high temperature and sufficiently emphasizing the reddish color of an object at a high temperature, is 1.9 times or less the value of the special color rendering index R9 in the case of an element temperature of 25° C.

Particularly, it is preferable that the value of the special color rendering index R9 at an element temperature of 60° C. is in the range of 65 to 95, the value of the special color rendering index R9 in the case of an element temperature of 25° C. is in the range of 45 to 60, and the value of the special color rendering index R9 at an element temperature of 60° C. is in the range of 1.2 to 1.9 times inclusive the value of the special color rendering index R9 in the case of an element temperature of 25° C.

The special color rendering index R14 (leaf) and the special color rendering index R15 (Japanese complexion) affect the appearance of foods such as fruits and vegetables, such as leaf vegetables (spinach etc.) and tubers (potatoes etc.). If the element temperature at which at least one of the special color rendering index R14 (leaf) and the special color rendering index R15 (Japanese complexion) has its maximum is in a range including temperatures higher than the element temperature at which the general color rendering index Ra has its maximum, at least one value of the special color rendering index R14 (leaf) and the special color rendering index R15 (Japanese complexion) increases in the temperature range of room temperature to 60° C. Accordingly, vegetables and fruits illuminated by light emitted from the organic electroluminescent element 1 look better at a high temperature. Particularly, it is preferable that both the element temperature at which the special color rendering index R14 (leaf) has its maximum and the element temperature at which the special color rendering index R15 (Japanese complexion) has its maximum are in a range including temperatures higher than the element temperature at which the general color rendering index Ra has its maximum.

Furthermore, in the range of temperatures from 60° C. to the element temperature at which the general color rendering index Ra has its maximum, if at least one of the special color rendering index R14 (leaf) and the special color rendering index R15 (Japanese complexion) increases with an increase in the element temperature, at least one value of the special color rendering index R14 (leaf) and the special color rendering index R15 (Japanese complexion) is the highest at a high temperature (about 60° C.). Accordingly, the appearance of vegetables and fruits is further improved. Particularly, it is preferable that both the special color rendering index R14 (leaf) and the special color rendering index R15 (Japanese complexion) increase with an increase in the element temperature.

Furthermore, it is preferable that in the element temperature range of 5° C. or greater to 60° C. or less, the element temperature at which at least one of the special color rendering index R14 (leaf) and the special color rendering index R15 (Japanese complexion) has its maximum is in the range of 40° C. or greater to 60° C. or less. In this case, the appearance of vegetables and fruits at a high temperature is further improved. Particularly, it is preferable that in the element temperature range of 5° C. or greater to 60° C. or less, both the element temperature at which the special color rendering index R14 (leaf) has its maximum and the element temperature at which the special color rendering index R15 (Japanese complexion) has its maximum are in the range of 40° C. or greater to 60° C. or less.

Furthermore, it is preferable that in the element temperature range of 25 to 60° C., the element temperatures at which the color rendering index R8 (reddish purple) and the special color rendering index R9 (red) have their maxima are higher than the element temperatures at which the special color rendering index R14 (leaf) and the special color rendering index R15 (Japanese complexion) have their maxima. In this case, as the temperature increases, the appearance of red becomes more dominant. The color of reddish foods gives psychological feeling of warmth and increases appetite, and therefore if such reddishness of foods becomes strong at a high temperature, purchase motivation increases and thus the red color is effective.

If any one of the color rendering index R8 (reddish purple), the special color rendering index R9 (red), the special color rendering index R14 (leaf), and the special color rendering index R15 (Japanese complexion) of the organic electroluminescent element 1 satisfies the above-described conditions, foods illuminated by light emitted from the organic electroluminescent element 1 at a high temperature look better. Since cooked dishes and the like include various colors of ingredients in one dish, in order to make such various colors look good, it is preferable that multiple indexes among the color rendering index R8 (reddish purple), the special color rendering index R9 (red), the special color rendering index R14 (leaf), and the special color rendering index R15 (Japanese complexion) satisfy the above-described conditions, and it is more preferable that all of the indexes satisfy the above-described conditions.

It is also preferable that with regard to the coordinates u', v' in the u', v' chromaticity diagram (CIE 1976 UCS chromaticity diagram) of the color of light emitted from the organic electroluminescent element 1 in the front direction, the value of u' increases more and the value of v' decreases more in the case where the element temperature is 60° C. than in the case where element temperature is 25° C. The front direction refers to a direction that is identical to the direction in which the plurality of layers constituting the organic electroluminescent element 1 are stacked. In this case, the color of light emitted from the organic electroluminescent element 1 turns more red as the temperature increases. Thus, persons who observe foods illuminated by light emitted from the organic electroluminescent element 1 at a high temperature also observe the reddish color of light emitted from the organic electroluminescent element 1, and the color of the emitted light psychologically affects the observers to promote their purchase motivation.

It also is preferable that the color temperature of the light emitted from the organic electroluminescent element 1 is lower in the case where the element temperature is 60° C. than in the case where the element temperature is 25° C. Also in this case, the color of light emitted from the organic electroluminescent element 1 turns more red as the temperature increases. Thus, persons who observe foods illuminated by light emitted from the organic electroluminescent element 1 also observe the reddish color of light emitted from the organic electroluminescent element 1, and the color of the emitted light psychologically affects the observers to promote their purchase motivation.

In addition to R8 and R9, R14 and R15 may be designed in a similar manner as mentioned above. Also in this case, the color of light turns more red psychologically as a whole. Hence, the same effect can be achieved.

Furthermore, it is preferable that the applied voltage necessary for allowing current densities at the element temperatures of 25° C. and 60° C. in the organic electroluminescent element 1 to have the same value is lower in a case where the element temperature is 60° C. than in a case where the element temperature is 25° C. In the lighting fixture 3, the conversion efficiency of the AC-DC converter decreases as the environmental temperature increases, and therefore the voltage required for operating a power source circuit increases. However, if the applied voltage can be reduced at a high temperature as described above, an increase in the total voltage inside the lighting fixture 3 at a high temperature is suppressed. Thus, it is possible to reduce the difference in power consumption of the lighting fixture 3 when at room temperature and at a high temperature.

The organic electroluminescent element 1 according to the present embodiment is suitable for normal indoor lighting at room temperature, and for the lighting of foods at a high temperature. Different intended uses and use conditions from room temperature to a high temperature can be realized using one type of an organic electroluminescent element 1. Thus, the need to develop and manufacture different organic electroluminescent elements 1 for different uses and conditions is eliminated, and therefore the cost can be reduced.

The organic electroluminescent element 1 according to the present aspect is realized as follows.

In the first light emitting unit 11, a blue region light emitting layer 21 and a first green region light emitting layer 22 are disposed close to a first electrode 15 and a second electrode 16, respectively. In the second light emitting unit 12, a red region light emitting layer 23 and a second green region light emitting layer 24 are disposed close to the first electrode 15 and the second electrode 16, respectively.

As described above, the first green region light emitting layer 22 contains fluorescent dopants, and the second green region light emitting layer 24 contains phosphorescent dopants. The phosphorescent dopants emit light even when they are in a triplet state, and therefore the phosphorescent dopants have a luminous efficiency that is approximately four times higher than that of fluorescent dopants emitting light only when they are in a singlet state, and highly efficient light emission, ideally an internal quantum efficiency of 100%, is possible.

Figure 2:
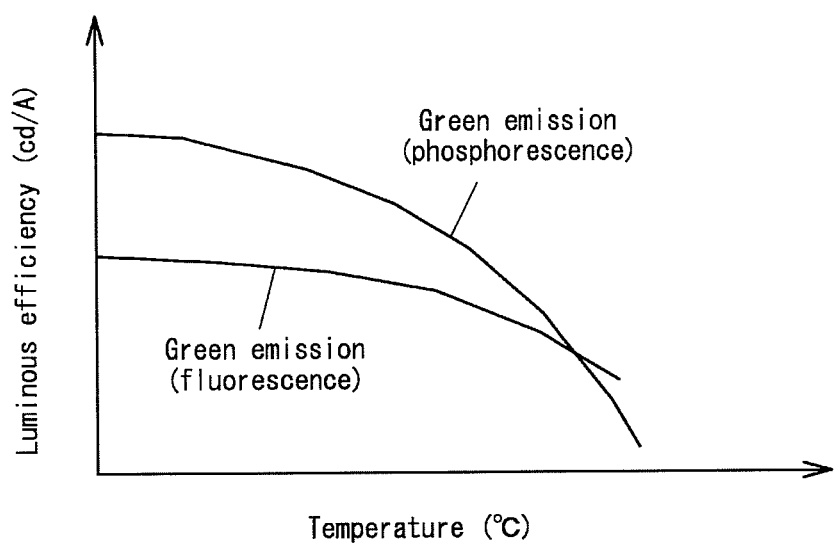
FIG. 2 is a graph showing one instance of the temperature dependency of the luminous efficiency of a green phosphorescent dopant and a green fluorescent dopant.

Furthermore, with regard to the green dopants, the luminous efficiency of the phosphorescent dopant has a higher temperature dependency than that of the fluorescent dopant. The value of the luminous efficiency of the phosphorescent dopant significantly decreases as compared with the fluorescent dopant at a high temperature, as shown in FIG. 2. This is because of high thermal inactivation of the phosphorescent dopant.

It is possible to design each color rendering property at room temperature and a high temperature utilizing the properties of such a green phosphorescent dopant. In other words, with the present embodiment, the organic electroluminescent element 1 includes both the green region light emitting layer 22 containing fluorescent dopants and the green region light emitting layer 24 containing phosphorescent dopants, and it is possible to realize an optimal color rendering property at room temperature and a high temperature respectively, utilizing differences in the temperature dependency of these green region light emitting layers 22 and 24.

For instance, in the graph shown in FIG. 2, if a temperature region in which there are slight changes in the luminous efficiencies of the fluorescent dopant and the phosphorescent dopant caused by temperature is close to room temperature, the intensity of a component in the green region of the entire emission spectrum is increased. The emission intensities of the red region light emitting layer 23 and the blue region light emitting layer 21 are designed so as to fit the intensity of green, and thus the general color rendering property can be designed so as to significantly increase at room temperature. If the luminous efficiency of phosphorescent dopant decreases in a high temperature region, the intensity of the component in the green region of the entire emission spectrum relatively decreases. Accordingly, the intensity of a component in the red region of the entire emission spectrum relatively increases, and the color of emitted light turns more red. Accordingly, the color rendering index R8, the special color rendering index R9, the special color rendering index R14, and the special color rendering index R15 increase at a high temperature, and u' value of the emitted light increases and the v' value thereof decreases, as a result of which the color temperature of the emitted light decreases.

With regard to the organic electroluminescent element 1 including the light emitting layer 2 designed to emit light in the red region, the light emitting layer 2 designed to emit light in the green region, and the light emitting layer 2 designed to emit light in the blue region, it is efficient to control the emission intensity of the light emitting layer 2 designed to emit light in the green region in order to design the emission spectrum for providing color rendering properties in accordance with the element temperature. This is because the green region is a medium wavelength region in the visible spectrum, and the base of a curve of the emission spectrum of the light emitting layer 2 designed to emit light in the green region overlaps with the red region on a long wavelength side and the blue region on a short wavelength side. Accordingly, if the emission intensity in the green region changes due to a change in the intensity of light emitted from the light emitting layer 2 designed to emit light in the green region, the emission intensities in the red region on a long wavelength side and the blue region on a short wavelength side also are accordingly affected. Thus, the values of various color rendering properties such as skin color that primarily contains red and green components and secondarily contains a blue component, blue-green intermediate between green and blue, and the like can be efficiently controlled with the intensity of the light emitted from the light emitting layer 2 designed to emit light in the green region. In other words, even if the types of dopants of red, green and blue and the film thickness of the light emitting layer 2 are not adjusted to individually optimize light emitted from the light emitting layer 2 of each color, the intensity of light emitted from the light emitting layer 2 designed to emit light in the green region is mainly adjusted, and blue and red are adjusted following green, as a result of which it is possible to realize various color rendering properties of the organic electroluminescent element 1 and the temperature dependencies of color rendering properties.

First, in order to achieve the configuration in which the general color rendering index Ra has its maximum at the element temperature of 15° C. to 35° C., the element is configured such that a color temperature calculated from the waveform of the emission spectrum at a temperature (for instance, 25° C.) that falls within the element temperature range of 15° C. to 35° C. lies on the color temperature curve, and the relative intensity of the emission spectrum in the green region increases on a low temperature side, and decreases on a high temperature side. Accordingly, the point of the color of emitted light on the u' v' chromaticity diagram (CIE 1976 UCS chromaticity diagram) intersects the color temperature curve in a transition from a low temperature to a high temperature. If this spectrum change is calculated with regard to the general color rendering index Ra, the general color rendering index Ra has a peak around room temperature.

As the element temperature decreases, the movement distance of an exciton is hardly affected by scattering and extends, and energy transfer from the green region light emitting layer 24 to the red region light emitting layer 23 increases. Therefore, in the case where the general color rendering index Ra has its maximum when the element temperature is low, it is preferable that the film thickness rate of the red region light emitting layer 23/the second green region light emitting layer 24 is smaller. On the other hand, it is preferable that the film thickness rate of the red region light emitting layer 23/the second green region light emitting layer 24 increases more with an increase in the element temperature at which the general color rendering index Ra has its maximum.

Figure 3:
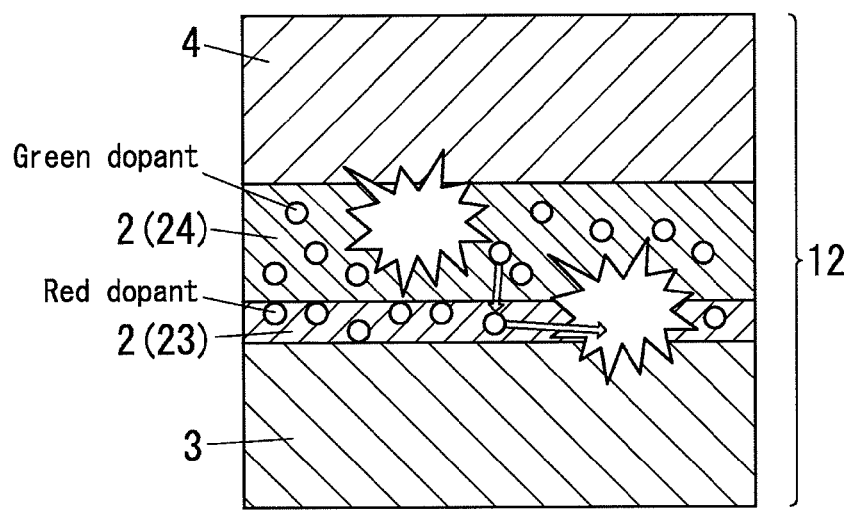
FIG. 3 is an estimated mechanism diagram showing a mechanism estimated to be the cause of the occurrence of a drop in emission intensity in a green region at a high temperature.

The temperature dependency of the emission intensity in the green region can be controlled by adjusting the thickness rate of the red region light emitting layer 23 to the second green region light emitting layer 24 of the second light emitting unit 12, the concentration of dopant, and the like. The phosphorescent dopants in the second green region light emitting layer 24 thermally inactivate more at a high temperature even in the case of a single dopant, and the emission intensity in the green region decreases. However, if the second green region light emitting layer 24 is in contact with the red region light emitting layer 23, the emission intensity in the green region further decreases at a high temperature. FIG. 3 shows a mechanism estimated to cause the occurrence of a drop in emission intensity. It is conceivable that in the second green region light emitting layer 24 adjacent to the red region light emitting layer 23, not all of the exciton energy causes green emission, and some exciton energy is transferred to the dopant or the host material inside the red region light emitting layer 23, and finally causes light emission in the red region in the red region light emitting layer 23. An exciton at the time of emitting phosphorescence usually has a longer exciton lifetime than that of fluorescent material because of transition from a triplet, and therefore energy transfer from the second green region light emitting layer 24 containing phosphorescent dopants to the red region light emitting layer 23 noticeably appears. The amount of energy transfer from the second green region light emitting layer 24 to the red region light emitting layer 23 can be controlled by adjusting the exciton lifetime, the movement distance of an exciton, the concentration of dopant, and the like.

For instance, as the thickness of the second green region light emitting layer 24 increases, the movement distance of an exciton from the second green region light emitting layer 24 to the red region light emitting layer 23 increases, and therefore the amount of transferred energy decreases. Also, as the thickness of the red region light emitting layer 23 decreases and/or the concentration of dopant in the red region light emitting layer 23 decreases, energy is unlikely to be transferred from the green region light emitting layer 22 to the red region light emitting layer 23. Also, in addition to the above, emission in the green region thermally inactivates greatly at a high temperature, and therefore the intensity of the spectrum in the green region decreases. Therefore, the effect that the relative intensity of the spectrum in the red region increases relative to the green region is obtained. Thus, by adjusting the thickness of the second green region light emitting layer 24, the thickness of the red region light emitting layer 23, the concentration of dopant in the red region light emitting layer 23, and the like, it is possible to design the element such that energy transfer from the second green region light emitting layer 24 to the red region light emitting layer 23 is sufficiently reduced at room temperature so that the emission intensity in the green region sufficiently increases, and that a sufficient amount of energy is transferred from the second green region light emitting layer 24 to the red region light emitting layer 23 at a high temperature so that the emission intensity in the green region decreases, or emission in the green region decreases due to thermal inactivation at a high temperature.

For instance, if the thickness of the second green region light emitting layer 24 increases, the influence of thermal inactivation in the second green region light emitting layer 24 increases at a high temperature and the intensity in the green region decreases, and the rates of intensities in the red region and the blue region relatively increase. In contrast, if the thickness of the second green region light emitting layer 24 decreases, the influence of thermal inactivation in the second green region light emitting layer 24 relatively decreases, and the rate of energy transfer from the second green region light emitting layer 24 to the red region light emitting layer 23 increases, as a result of which the intensity in the red region increases. If the thickness of the second green region light emitting layer 24 is excessively reduced, energy transfer to the red region light emitting layer 23 is too large even at room temperature to obtain a high general color rendering property at room temperature. On the other hand, if the thickness of the red region light emitting layer 23 increases, the intensity in the red region increases, and if the thickness thereof decreases, the intensity in the red region decreases. Taking these facts into consideration, the optimal thicknesses of the second green region light emitting layer 24 and the red region light emitting layer 23 and the thickness rate can be determined. Particularly, it is preferable that the thickness of the red region light emitting layer 23 is adjusted in the range of 2% or greater to 15% or less of the thickness of the second green region light emitting layer 24. Since the movement distance of an exciton of phosphorescence is usually greater than or equal to 20 nm and less than or equal to 60 nm, it is preferable that the thickness of the second green region light emitting layer 24 is the same extent as this, that is, greater than or equal to 20 nm and less than or equal to 60 nm, taking into consideration energy transfer from the second green region light emitting layer 24 to the red region light emitting layer 23.

From the point of view of optical design, if the total thickness of the red region light emitting layer 23 and the second green region light emitting layer 24 is a constant value, the proportion of the emission intensity of the red region light emitting layer 23 to the emission intensity of the second green region light emitting layer 24 can be controlled in a state in which the total thickness of the entire organic electroluminescent element 1 is kept at an optically optimal thickness. Hence, the degree of freedom in designing can be improved. In other words, it is possible to design an element having a low driving voltage and high efficiency. Therefore, it is desirable to select each film thickness in the range of the above-described film thickness.

Also, if the concentration of dopant in the red region light emitting layer 23 is excessively increased, the luminous efficiency decreases due to concentration quenching, but a high concentration of dopant is more advantageous to receiving energy transfer from the second green region light emitting layer 24. The optimal value of the concentration of dopant is determined taking this balance into consideration. Particularly, it is preferable that the concentration of dopant in the red region light emitting layer 23 is adjusted in the range of 0.2% by mass or greater to 10% by mass or less. Concentration quenching noticeably occurs particularly in the case where phosphorescent dopant is used. This is because energy movement/thermal inactivation of an exciton is likely to occur between dopants because phosphorescence has a long exciton lifetime.

In a specific process of designing an element, for instance, the emission spectrum of white light of the element is separated with simulation based on the photoluminescence (PL) spectra of individual dopants used in the red region, blue region and green region light emitting layers 2. At this time, in order to calculate the contribution of a spectrum of each color to the color rendering property at a given temperature, first, the emission spectrum of white light of the element is separated into spectra in the red region, the blue region and the green region. Next, the area % of a spectrum of each color occupying the white spectrum can be firstly calculated at a given temperature by determining the size (for instance, the inner area of the spectrum) of the spectrum of each color. Next, a change with temperature in the area % of a spectrum of each color can be determined by separating white spectra at various temperatures into spectra of RGB with the above-described method. Finally, the relationship between the color rendering property calculated from the white spectrum itself and the area % of each color described above can be determined from the contribution of each factor (that is, the magnitude of a change with temperature in the area % of each color) by using and approximating data on a change with temperature of an individual factor with multiple regression. Specifically, assuming that a change with temperature in a color rendering property is Y, and changes with temperature in spectra of respective colors are Rx, Gx, and Bx, respectively, the contributions of Rx, Gx and Bx to Y need only be calculated when Y is approximated as follows:

$$Y = \alpha \times Rx + \beta \times Gx + \gamma \times Bx + \text{(constant term)} \text{ (where } \alpha, \beta \text{ and } \gamma \text{ are coefficients)}.$$

Color rendering properties can be controlled by adopting another method, instead of designing the red region light emitting layer 23 and the second green region light emitting layer 24 as described above, or in addition to this.

For instance, the color rendering properties can be controlled by selecting organic materials constituting the first light emitting unit 11, the second light emitting unit 12, the interlayer 13, and the like. The electron mobility (hole mobility or electron mobility) of these organic materials has temperature dependency. By using the temperature dependency of such electron mobility, it is possible to control the temperature dependency of an emission spectrum.

For instance, the location at which carrier balance in the organic electroluminescent element 1 at a high temperature has its maximum is adjusted by selecting organic material so as to be positioned near the first light emitting unit 11. Accordingly, the emission intensity of the second green region light emitting layer 24 at a high temperature is suppressed. Generally, charge mobility of organic material increases more as the temperature increases, and for instance, if a change with temperature in the hole mobility of the hole transport material used in the first light emitting unit 11 is relatively small and a change with temperature in the electron mobility in the electron transport material used in the second light emitting unit 12 is relatively large, light emitted from the first light emitting unit 11 is more intense at a high temperature, and thus the emission intensity of the second green region light emitting layer 24 is suppressed.

By selecting the organic material, it is possible to realize a configuration in which the applied voltage required for making the current densities at the element temperatures of 25° C. and 60° C. in the organic electroluminescent element 1 have the same value is lower in the case where the element temperature is 60° C. than in the case where the element temperature is 25° C. In other words, the organic electroluminescent element 1 having the above-described properties can be obtained by selecting an organic material that leads to an increase in charge mobility (hole mobility or electron mobility) along with an increase in temperature.

The structure of the organic electroluminescent element 1 is not limited to the above-described instance. For instance, the number of light emitting units may be one or three or greater. If the number of light emitting units increases, a high luminous efficiency is increased in accordance with the number of units even when the current amount is constant. Also, it is possible to suppress short-circuits between electrodes caused by foreign objects or minute unevenness of the substrate 14, defects caused by leakage current, and the like because of an increase in the total film thickness of the organic electroluminescent element 1. Hence, the yield is improved. Furthermore, the overall number of light emitting layers 2 in the entire organic electroluminescent element 1 is increased by providing each of the plurality of light emitting units with one or multiple light emitting layers 2. Variation on the plane of the element, and variations in brightness, chromaticity and color rendering properties at a viewing angle are mainly caused by shift in optical interference in the organic electroluminescent element 1. Therefore, if the total number of light emitting layers 2 in the organic electroluminescent element 1 increases, the optical interference is more averaged and variations in these performance variations are reduced. Since interference conditions change with not only the number of light emitting layers 2 but also the positions of the light emitting layers 2 in the element, it is preferable that the both are designed in correspondence with each other. Furthermore, if the number of light emitting layers 2 having the same light emitting color is large, a change in lifetime characteristics at conduction also is averaged, and therefore an effect of suppressing lifetime variation can also be obtained.

There is no particular limitation on the number of light emitting layers 2 in one light emitting unit, and the number thereof may be one, two or greater. Also, in the structure of the organic electroluminescent element 1 described above, the structure of the light emitting layer 2 of the first light emitting unit 11 and the structure of the light emitting layer 2 in the second light emitting unit 12 may be switched.

Both the dopant of the first green region light emitting layer 22 and the dopant of the second green region light emitting layer 24 may be a phosphorescent dopant. In this case, if the change with temperature in the emission intensity in the green region further increases, the change with temperature in color rendering properties further increases. Such organic electroluminescent elements 1 can be applied to uses in which the change with temperature in color rendering properties is further actively utilized, for instance. If a fluorescent dopant having a large temperature dependency of emission intensity is used, the dopant of the light emitting layer 2 designed to emit light in the green region may be only a fluorescent dopant (for instance, both the dopant of the first green region light emitting layer 22 and the dopant of the second green region light emitting layer 24 are a fluorescent dopant). In other words, the organic electroluminescent element 1 may include at least one light emitting layer 2 designed to emit light in the green region and have a high temperature dependency of emission intensity, in which emission intensity decreases at a high temperature.

Also, although the shape of an emission spectrum is most easily adjusted by the emission intensity of the light emitting layer 2 designed to emit light in the green region as described above, for instance, even in the case where the organic electroluminescent element 1 includes the phosphorescent red region light emitting layer 2 and the fluorescent red region light emitting layer 2, an effect of adjusting the change with temperature in color rendering properties can be obtained.

It is preferable that the organic electroluminescent element 1 includes one or more of each of the light emitting layer 2 designed to emit green light, the light emitting layer 2 designed to emit red light, and the light emitting layer 2 designed to emit blue light. However, if the organic electroluminescent element 1 according to the present invention can be realized by utilizing the temperature dependencies of emission properties of the phosphorescent light emitting layer 2, combinations of various light emitting layers 2 may be adopted, such as a combination of the light emitting layer 2 designed to emit blue light and the light emitting layer 2 designed to emit yellow light, a combination of the light emitting layer 2 designed to emit blue light, the light emitting layer 2 designed to emit orange light, and the light emitting layer 2 designed to emit red light, and the like.

[Second Aspect]

In the second aspect of the organic electroluminescent element 1 of the present embodiment, it is preferable that with regard to the element temperature range of 0° C. to 60° C., at least one of the special color rendering index R8, the special color rendering index R9, the special color rendering index R14, and the special color rendering index R15 has its maximum in a range of the element temperature of 10° C. to 30°. In this case, the appearance of food at an environmental temperature suitable for humans is improved. For example, when at least one of the color rendering index R8 and the special color rendering index R9 has its maximum in the range of the element temperature of 10° C. to 30°, the appearance of reddish meat is improved. When the special color rendering index R14 has its maximum in the range of the element temperature of 10° C. to 300, the appearances of vegetables or fruits which are bluish like leaves are improved. When the special color rendering index R15 has its maximum in the range of the element temperature of 10° C. to 30°, the appearances of whitish vegetables and true human complexions are improved.

Further, in the embodiment, in the element temperature range of 0° C. to 30° C., at least one of the general color rendering index Ra, the special color rendering index R8, the special color rendering index R14, and the special color rendering index R15 satisfies a condition that a proportion of its minimum to its maximum is equal to 0.8 or more and a value thereof is equal to 70 or more. In this case, the high color rendering properties are maintained between the environmental temperature suitable for humans and the environmental temperature used for storing food at a low temperature. Hence, the chromatic appearance of food is hardly changed between a case where the food is consumed and a case where the food is stored. Consequently, a person who observes food can accurately perceive a condition of the food based on the appearance of the food. Additionally, a person who observes food hardly gets a psychological feeling of strangeness.

Furthermore, it is preferable that in the element temperature range of 0° C. to 30° C., the special color rendering index R9 has a proportion of its minimum to its maximum that is equal to 0.75 or more. Furthermore, it is preferable that the special color rendering index R9 is not less than 40 in the element temperature range of 0° C. to 30° C. In this case, the special color rendering index R9 is kept sufficiently high between the environmental temperature suitable for humans and the environmental temperature used for storing food at a low temperature. Hence, the chromatic appearance of food (e.g., reddish meat) is hardly changed between a case where the food is consumed and a case where the food is stored. Consequently, a person who observes food (e.g., reddish meat) can accurately perceive a condition of the food based on the appearance of the food. Thus, the hygienic management of food is facilitated.

Moreover, it is preferable that the values of u' and v' in the u', v' chromaticity diagram of a color of light in the front direction are greater in the case where the element temperature is 0° C. than in the case where the element temperature is 25° C. In this case, food illuminated by light emitted from the organic electroluminescent element in a low temperature is inclined to be reddish overall. Hence, it is possible to suppress the psychological effect that a person who observes food at a low temperature gets the impression that the food is cool.

Additionally, a color temperature of light is lower in the case where the element temperature is 0° C. than in the case where the element temperature is 25° C. In this case, food illuminated by light emitted from the organic electroluminescent element in a low temperature is inclined to be reddish overall. Hence, it is possible to suppress the psychological effect that a person who observes food at a low temperature gets the impression that the food is cool.

As mentioned above, the organic electroluminescent element 1 of the present aspect has the high color rendering properties in a range of a low temperature to room temperature. At a temperature in a wide range from a low temperature to room temperature, the organic electroluminescent element 1 of the present aspect is widely available for various purposes under various use conditions. Especially, the organic electroluminescent element 1 of the present aspect is suitable for food lighting at a temperature in a range from a low temperature to room temperature.

Figure 8:
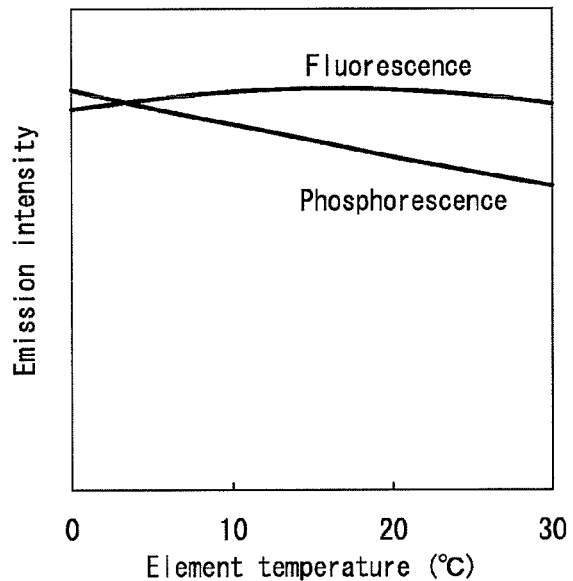
FIG. 8 is a graph showing instances of relative values of emission intensities of fluorescent and phosphorescent light emitting layers at various element temperatures.

For example, when the light emitting layers 2 of the organic electroluminescent element 1 include the blue region light emitting layer 21 containing fluorescent dopants, the green region light emitting layer 22 containing fluorescent dopants, the red region light emitting layer 23 containing phosphorescent dopants, and the green region light emitting layer 24 containing phosphorescent dopants, the light emitting characteristics of the organic electroluminescent element 1 of this second aspect can be realized by utilizing the difference in the temperature dependency of the emission intensity between the light emitting layer containing fluorescent dopants and the light emitting layer containing phosphorescent dopants. FIG. 8 shows instances of relative values of the emission intensity of the fluorescent light emitting layer (the sum of the emission intensity of the blue region light emitting layer 21 containing the fluorescent dopants and the emission intensity of the green region light emitting layer 22 containing the fluorescent dopants) and the emission intensity of the phosphorescent light emitting layer (the sum of the emission intensity of the red region light emitting layer 23 containing the phosphorescent dopants and the emission intensity of the green region light emitting layer 24 containing the phosphorescent dopants) at the different element temperatures. This shows that, in the range of the element temperature of 0° C. to 30° C., the fluorescent emission intensity has a maximum (local maximum) but the phosphorescent light emission intensity monotonically decreases with an increase in the element temperature. Hence, by designing the element to weaken temperature dependency of each of the fluorescent emission intensity and the phosphorescent emission intensity, it is possible to allow the color rendering index R8, the special color rendering index R9, the special color rendering index R14, and the special color rendering index R15 to have their maxima in the range of element temperature of 10° C. to 30° C. Further, with a decrease in the element temperature, the phosphorescent emission intensity increases more than the fluorescent emission intensity does. According to this, a component in the red region of the whole emission spectrum relatively increases, and therefore the emission color becomes reddish. Consequently, at a low temperature, the values u' and v' increase and the color temperature of the light increases.

[Lighting Fixture]

Figure 4:
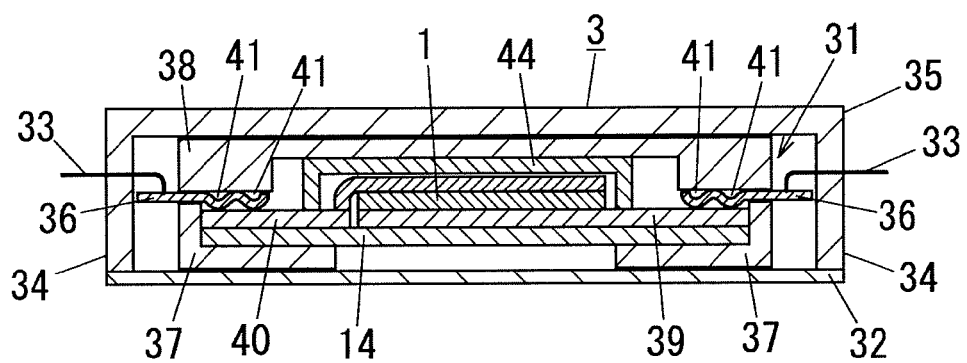
FIG. 4 is a cross-sectional view showing a lighting fixture in an embodiment of the present invention.
Figure 5:
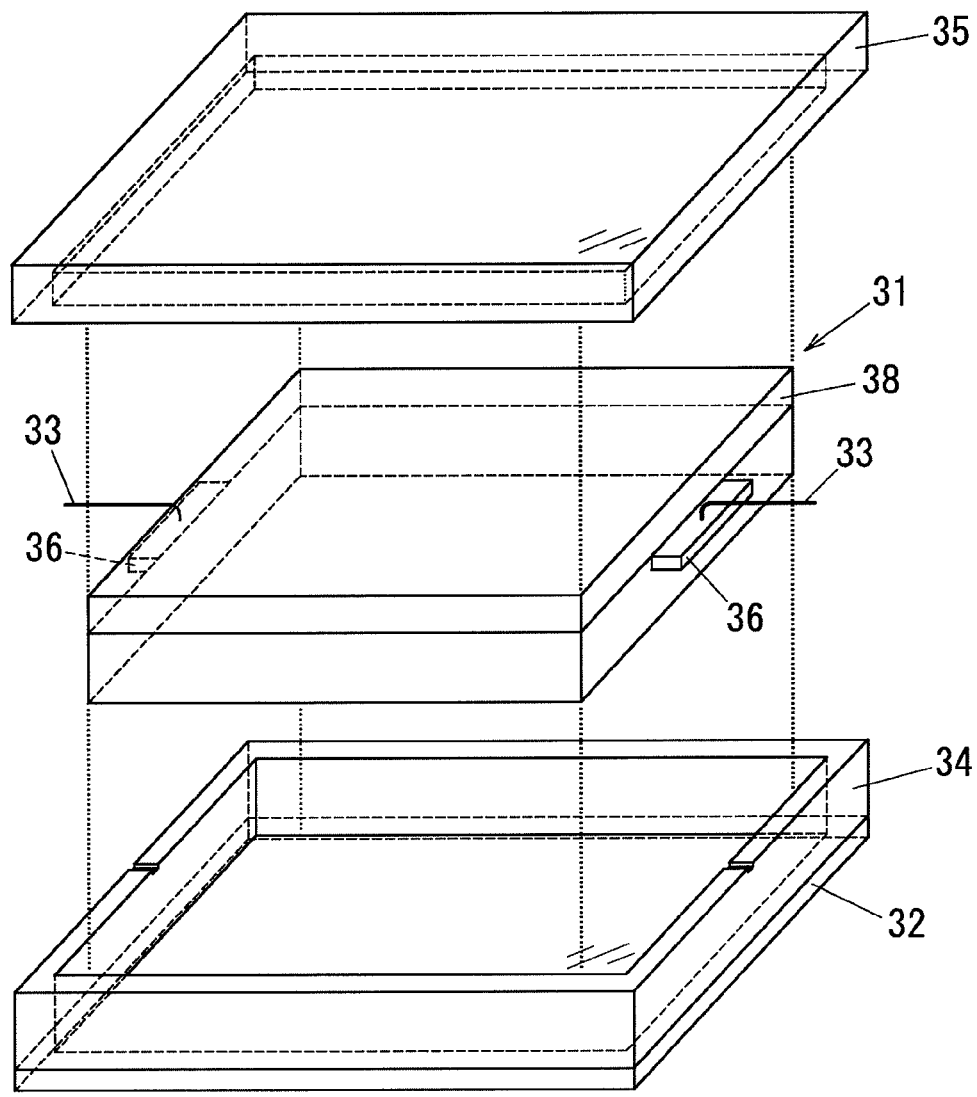
FIG. 5 is an exploded perspective view of the lighting fixture.
Figure 6:
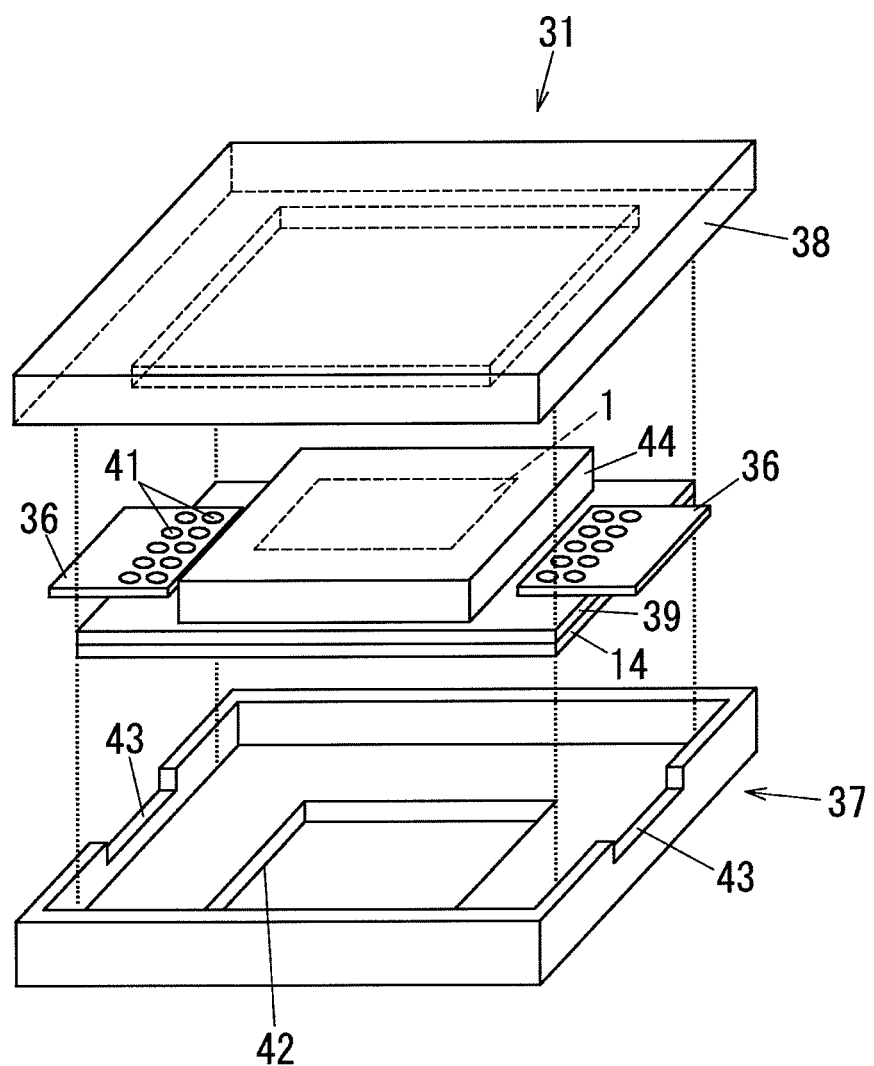
FIG. 6 is an exploded perspective view showing a unit in the lighting fixture.

The lighting fixture 3 includes the organic electroluminescent element 1, a connection terminal connecting the organic electroluminescent element 1 and a power source, and a housing holding the organic electroluminescent element 1. FIGS. 4 to 6 show one instance of the lighting fixture 3 including the organic electroluminescent element. The lighting fixture 3 includes: a unit 31 that includes the organic electroluminescent element 1; a housing that holds the unit 31; a front panel 32 that transmits light emitted from the unit 31; and wiring units 33 for supplying power to the unit 31.

The housing includes a front-side housing 34 and a back-side housing 35. The front-side housing 34 is formed into a frame shape, and the back-side housing 35 is formed into a lid shape having an open bottom. The front-side housing 34 and the back-side housing 35 are laid on top of each other so as to hold the unit 31 therebetween. The front-side housing 34 has grooves for allowing the wiring units 33 that are conductive leads, connectors, etc. to pass through, at a peripheral portion that comes into contact with the side wall of the back-side housing 35, and moreover, the plate-shaped front panel 32 having transparency is disposed at the open bottom.

The unit 31 includes the organic electroluminescent element 1, power supply parts 36 for supplying power to the organic electroluminescent element 1, a front-side case 37 and a back-side element case 38. The front-side case 37 and the back-side element case 38 hold the organic electroluminescent element 1 and the power supply units 36 therebetween.

A positive electrode 39 connected to the first electrode 15 and a negative electrode 40 connected to the second electrode 16 are formed on the substrate 14 of the organic electroluminescent element 1. A sealing substrate 44 is also provided on the substrate 14 to cover the organic electroluminescent element 1. The pair of power supply units 36 connected to the wiring units 33 come into contact with the positive electrode 39 and the negative electrode 40 respectively to supply power to the organic electroluminescent element 1.

One of the power supply parts 36 has a plurality of contacts 41 that make contact with the positive electrode 39 and the other includes a plurality of contacts 41 that make contact with the negative electrode 40. These contacts 41 are pressed against corresponding one of the positive electrode 39 and the negative electrode 40 by the element cases 37 and 38. Consequently, the power supply parts 36 are mechanically and electrically connected to the positive electrode 39 and the negative electrode 40 at many points, respectively. Each contact 41 is formed into a dimpled shape by performing a bending process on the power supply part 36 made of a metal conductor such as a copper plate or a stainless steel plate, and protrusions defined by the dimpled portions come into contact with corresponding one of the positive electrode 39 and the negative electrode 40. Note that for instance, the power supply part 36 may be a power supply unit obtained by providing a line-shaped metal conductor with coil-shaped contacts 41, instead of the power supply part obtained by providing a plate-shaped metal conductor with the dimpled contacts 41.

The element cases 37 and 38 are each formed into a lid shape. The front-side element case 37 is provided at a case wall facing the substrate 14 of the organic electroluminescent element 1 with an opening portion 42 for allowing light to pass, and is provided at a case side wall with groove portions 43 for receiving the power supply parts 36. The element cases 37 and 38 are formed of resin such as acryl or the like, and are laid on top of each other so that side walls thereof come into contact with each other to form a rectangular parallelepiped box shape, and hold the organic electroluminescent element 1 and the power supply parts 36 therebetween.

A food storage device includes a storage configured to store food, and the lighting fixture 3. The lighting fixture 3 includes the organic electroluminescent element 1 configured to illuminate food in the storage. Specific instances of the storage include a showcase and a dish display shelf for a buffet. It is preferable that the food storage device includes a heater for heating food stored in the storage and keeping the temperature thereof. It is preferable that the storing temperature is about 60° C. to mainly prevent food poisoning.

Figure 7:
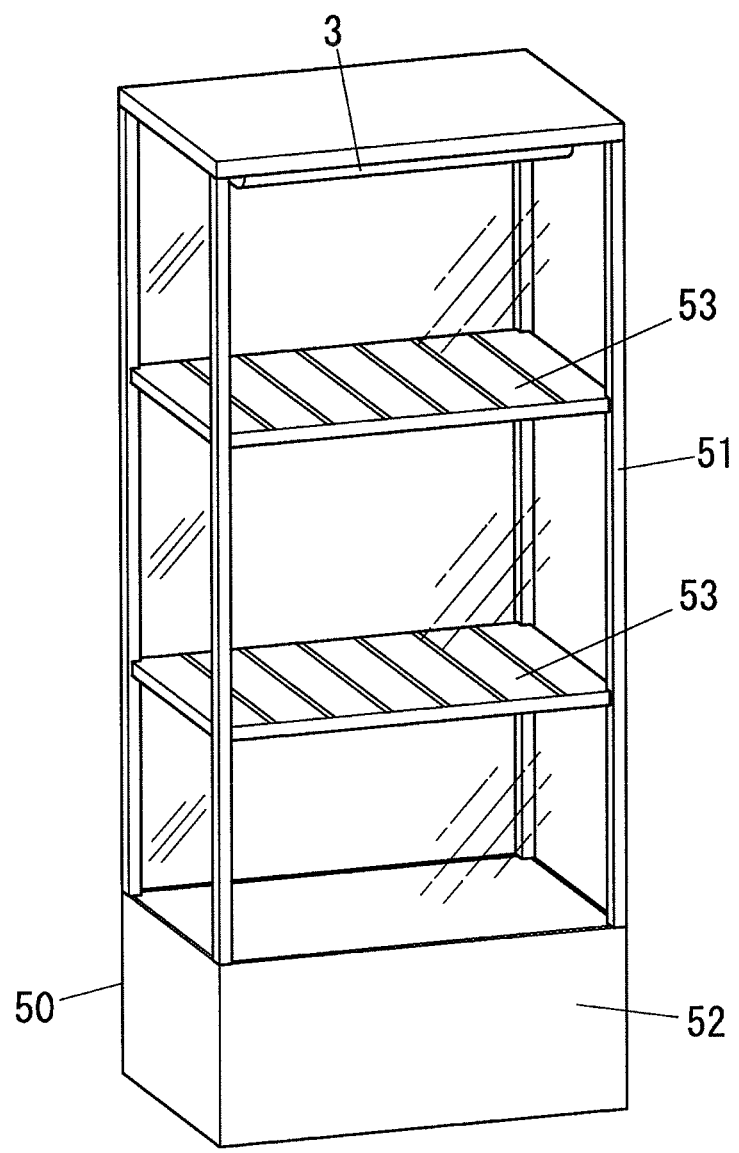
FIG. 7 is a perspective view showing one instance of a food storage device in an embodiment of the present invention.

FIG. 7 shows one instance of such a food storage device 50. The food storage device 50 includes a main body unit 52 and a storage 51 placed on the main body unit 52. The storage 51 is a glass showcase, and shelves 53 are installed inside it. Furthermore, the lighting fixture 3 is fixed to the ceiling of the storage 51. The lighting fixture 3 illuminates the interior of the storage 51. A heater for heating the interior of the storage 51 is installed inside the main body unit 52.

This food storage device 50 can be used for storing ingredients or cooked dishes at a high temperature and display them to a customer, for the purpose of selling them. According to this food storage device 50, the appearance of foods can be significantly improved by illuminating foods stored in the storage 51 at a high temperature with light emitted from the lighting fixture 3 including the organic electroluminescent element 1.

EXAMPLES

First Example

The first electrode 15 was formed by forming ITO into a film having a thickness of 130 nm on the glass substrate 14. Furthermore, a hole injection layer made of PEDOT/PSS and having a thickness of 35 nm was formed on the first electrode 15 with a wet method. Subsequently, the hole transport layer 3, the blue region light emitting layer 21 (fluorescence), the first green region light emitting layer 22 (fluorescence), and the electron transport layer 4 were successively formed so as to each have a thickness of 5 nm to 60 nm, with a vapor deposition method. Next, the interlayer 13 having a layer structure of Alq3/Li$_2$O/Alq3/HAT-CN6 was placed thereon with a layer thickness of 15 nm. Next, the hole transport layer 3, the red region light emitting layer 23 (phosphorescence), the second green region light emitting layer 24 (phosphorescence), and the electron transport layer 4 were successively formed so that each layer has a maximum film thickness of 50 nm. Subsequently, an electron injection layer constituted by a Li film and the second electrode 16 constituted by an Al film were successively formed. The thickness of the red region light emitting layer 23 was 2.5 nm, and the thickness of the second green region light emitting layer 24 was 40 nm.

The peak wavelength of the emission spectrum of the dopant in the blue region light emitting layer 21 was 450 nm, the peak wavelength of the emission spectrum of the dopant in the second green region light emitting layer 24 was 563 nm, and the peak wavelength of the emission spectrum of the dopant in the red region light emitting layer 23 was 620 nm.

The peak intensity proportion of blue (450 nm): green (563 nm): red (623 nm) in the emission spectrum of light emitted from the organic electroluminescent element 1 at an element temperature of 30° C. was 1:1.5:2.5.

Figure 9:
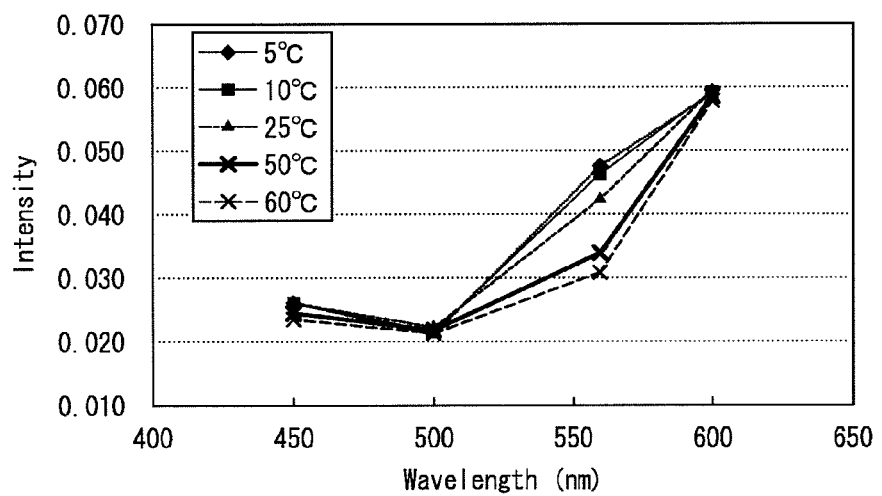
FIG. 9 is a graph showing change with temperature in emission intensity for an organic electroluminescent element in the first example of the present invention at wavelengths of 450 nm corresponding to a peak position of a color matching function X, 560 nm corresponding to a peak position of a color matching function Y, 600 nm corresponding to a peak position of a color matching function Z, and 500 nm corresponding to a valley position located between the peaks.

Also, FIG. 9 shows the changes with temperature in the emission intensities of the organic electroluminescent element 1 at wavelengths of 450 nm corresponding to a peak position of the color matching function X, 560 nm corresponding to a peak position of the color matching function Y, 600 nm corresponding to a peak position of the color matching function Z, and 500 nm corresponding to a valley position between the peaks in XYZ color matching functions that are important for color rendering-properties.

The change with temperature in spectrum intensity around a Y peak wavelength 560 nm of the color matching functions is increased as a result of selecting the thicknesses, concentrations of dopant, etc. of the red region light emitting layer 23 and the second green region light emitting layer 24. The Y peak wavelength of the color matching functions corresponds to the position of the wavelength at which the luminosity factor is maximized. In short, the numerical values of color rendering properties can be adjusted to be designed values, by mainly controlling the intensity of the spectrum at 560 nm. The intensity proportion at wavelengths corresponding to peak positions of the color matching functions XYZ, etc. need only to be designed by appropriately selecting the types of dopant, the concentration of dopant, the thickness of the light emitting layer 2 and the like, and the charge mobility of the light emitting layer 2, for instance.

The spectrum, the various color rendering properties, and the color of light emitted from the organic electroluminescent element 1 at an element temperature of 5 to 60° C. were measured using a spectral radiance meter (CS-2000), and the obtained results were as follows.

Figure 10:
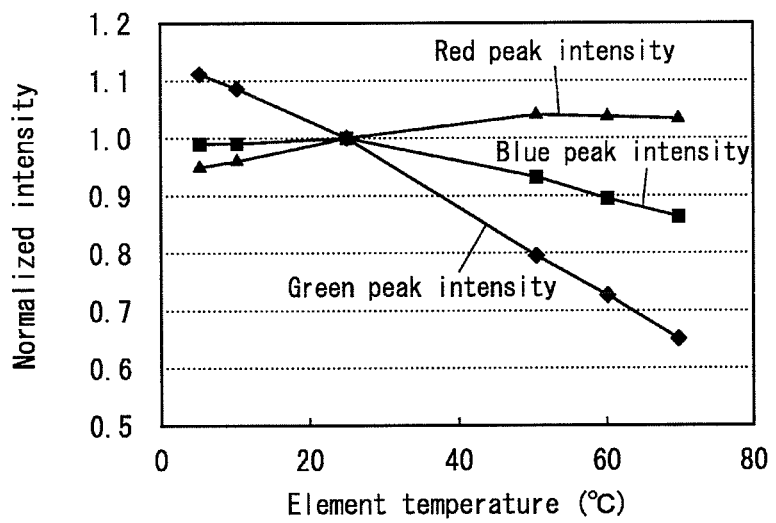
FIG. 10 is a graph showing the temperature dependency of intensities of peaks of blue, green, and red in the emission spectrum of light emitted from the organic electroluminescent element in the first example.

FIG. 10 shows relative values (normalized such that the intensity at 25° C. is equal to 1) of intensities of the peaks of blue (450 nm): green (563 nm): red (623 nm) in the emission spectrum of light emitted from the organic electroluminescent element 1 at various element temperatures. When the element temperature increases, the intensity of the peak of green changes the most, and decreases the most at a high temperature.

Figure 11:
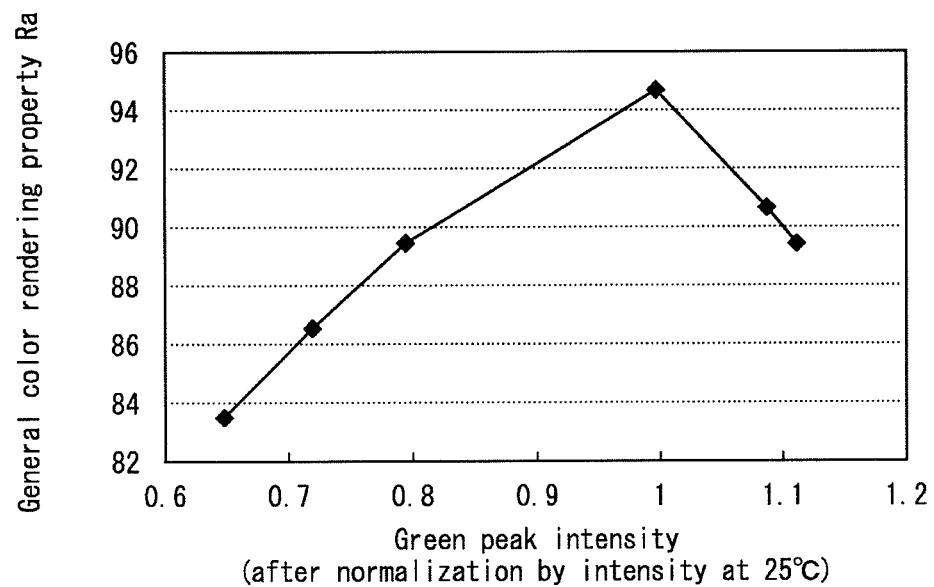
FIG. 11 is a graph showing a relationship between the green peak intensity and a general color rendering index Ra in the emission spectrum of light emitted from the organic electroluminescent element in the first example.

FIG. 11 shows the relationship between the green peak intensity and the general color rendering index Ra. When both are approximated with a quadratic function, the correlation coefficient is 91%, and hence they are highly correlated. When similar approximation is performed on red and blue peak intensities, the correlation coefficient for red is 56% and the correlation coefficient for blue is 81%. As seen from the above, the correlation between the green peak intensity and the general color rendering index Ra is high.

Similar plotting was carried out with regard to the color rendering index R8, the special color rendering index R9, the special color rendering index R14, and the special color rendering index R15 to calculate correlation coefficients. The result thereof is shown in TABLE 1. This result shows that, for all of the color rendering index R8, the special color rendering index R9, the special color rendering index R14, and the special color rendering index R15, the correlation coefficient with the green peak intensity is high. Therefore, according to the configuration of the present example, the temperature dependencies of various color rendering properties can be easily adjusted by optimizing the temperature dependency of green peak intensity.

As shown in TABLE 1, the general color rendering index Ra has a high value of 85 or greater in a wide element temperature range of 5° C. to 60° C. This is realized by the organic electroluminescent element 1 according to the present example including the fluorescent first green region light emitting layer 22 and the phosphorescent second green region light emitting layer 24, and by utilizing the temperature dependencies of these emission intensities. The general color rendering index Ra has a peak at the element temperature of 25° C., and the value of the general color rendering index Ra is significantly high at 95. The difference between the maximum and the minimum of the general color rendering index Ra is about 10% in the range of the element temperature of 5° C. to 60° C., and the absolute value of the general color rendering index Ra is 86 (60° C.) at the lowest, and stable and high color rendering properties are obtained.

Both the color rendering index R8 (reddish purple) and the special color rendering index R9 (red) are increased with an increase in the element temperature, and they are maximized at 60° C. in the range of measurement. The value of R9 at 60° C. is 1.4 times that at 25° C. In other words, the general color rendering index Ra is high at room temperature, and accordingly R9 is high at a high temperature.

Both the special color rendering indexes R14 and R15 have peak values at an element temperature of 50° C. Although R9 is maximized at an element temperature of 60° C., the absolute value thereof is 74, which is lower than R14 and R15. If the element is designed to slightly suppress R14 and R15 at a high temperature in this manner, effects of emphasizing red of R9 increase at an element temperature of 60° C., and effects of psychologically adding warmth to food are obtained.

TABLE 1

|  |  | Element temperature | | | | | Correlation Coefficient | | |
| --- | --- | --- | --- | --- | --- | --- | --- | --- | --- |
|  |  | 5° C. | 10° C. | 25° C. | 50° C. | 60° C. | Red | Green | Blue |
| General color rendering index | Ra | 89.4 | 90.6 | 94.6 | 89.4 | 86.5 | 57.6 | 91.5 | 80.7 |
| Color rendering index | R8 | 74.0 | 75.0 | 80.0 | 84.0 | 85.0 | 97.5 | 99.5 | 74.6 |
| Special color rendering index | R9 | 36.7 | 40.3 | 53.1 | 70.2 | 73.8 | 96.3 | 99.9 | 85.3 |
|  | R14 | 96.2 | 96.4 | 97.0 | 98.4 | 97.0 | 14.9 | 84.1 | 77.9 |
|  | R15 | 84.8 | 86.4 | 92.1 | 98.0 | 96.1 | 96.5 | 99.6 | 66.9 |

In a constant temperature test chamber, a bulb-type fluorescent lamp (R9 was 25) and the element according to the present example were placed, a tomato and a cooked meat dish used as reddish foods were placed, a color chart of color rendering properties of R8 and R9 was placed, and the appearance was observed while the element temperature was increased from 25° C. to 60° C. At that time, with the element according to the present example, R9 was 53 at 25° C., which was twice or greater than that of the fluorescent lamp. In that case, the colors of the foods and the color chart that were placed are reproduced well. Furthermore, when the temperature was increased to 60° C., R9 of the element increased to 74. Hence, the color can be reproduced significantly vividly.

TABLE 2 shows the chromaticity u' and v', color temperatures, and the applied voltage necessary to achieve the current density of 5 mA/cm$^2$ in the cases where the element temperature is 25° C. and 60° C. in the element according to the present example.

TABLE 2

|  |  | Applied voltage (V) | Color temperature (K) | Chromaticity u' | Chromaticity v' |
| --- | --- | --- | --- | --- | --- |
| Element temperature | 25° C. | 7.7 | 3000 | 0.25 | 0.520 |
|  | 60° C. | 6.9 | 2600 | 0.27 | 0.516 |

This shows that when the element temperature is increased up to 60° C., u' is increased and v' is decreased and that the color temperature is decreased at a high temperature. Furthermore, the voltage is decreased at a high temperature. Hence, the element according to the present example is enabled to emit light having warmth with lowered power at a high temperature.

As obvious from the above, with using the organic electroluminescent 1 element of the present example, it is possible to realize a high general color rendering index Ra suitable for indoor lighting at room temperature. Also, the same element can be used for the purpose of improving the appearance of foods and dishes in a high temperature environment.

In other words, it is possible to obtain effects that the element can be used in common, and development cost can be reduced, and therefore the production cost can be reduced and the standardization of lighting apparatuses can be promoted.

Second Example

The first electrode 15 was formed by forming ITO into a film having a thickness of 130 nm on the glass substrate 14. Furthermore, a hole injection layer made of PEDOT/PSS and having a thickness of 35 nm was formed on the first electrode 15 with a wet method. Subsequently, the hole transport layer 3, the blue region light emitting layer 21 (fluorescence), the first green region light emitting layer 22 (fluorescence), and the electron transport layer 4 were successively formed so as to each have a thickness of 5 nm to 60 nm, with a vapor deposition method. Next, the interlayer 13 having a layer structure of Alq3/Li$_2$O/Alg3/HAT-CN6 was placed thereon with a layer thickness of 15 nm. Next, the hole transport layer 3, the red region light emitting layer 23 (phosphorescence), the second green region light emitting layer 24 (phosphorescence), and the electron transport layer 4 were successively formed so that each layer has a maximum film thickness of 50 nm. Subsequently, an electron injection layer constituted by a Li film and the second electrode 16 constituted by an Al film were successively formed. The thickness of the red region light emitting layer 23 was 5 nm, and the thickness of the second green region light emitting layer 24 was 40 nm. With this process, the organic electroluminescent element 1 was prepared.

Figure 12:
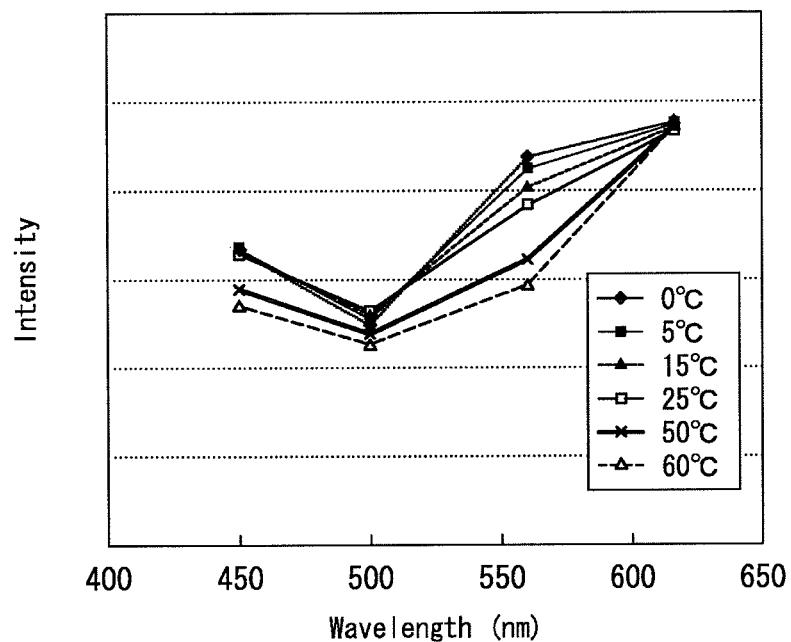
FIG. 12 is a graph showing change with temperature in emission intensity for an organic electroluminescent element in the second example of the present invention at wavelengths of 450 nm corresponding to a peak position of a color matching function X, 560 nm corresponding to a peak position of a color matching function Y, 616 nm corresponding to a peak position of a color matching function Z, and 500 nm corresponding to a valley position located between the peaks.

FIG. 12 shows the changes with temperature in the emission intensities of the organic electroluminescent element 1 at wavelengths of 450 nm corresponding to the peak position of the color matching function X, 560 nm corresponding to the peak position of the color matching function Y, 616 nm corresponding to the peak position of the color matching function Z, and 500 nm corresponding to the valley position between the peaks in XYZ color matching functions that are important for color rendering properties.

Further, the peak intensity proportion of blue (450 nm): green (563 nm): red (623 nm) in the emission spectrum of light emitted from the organic electroluminescent element 1 at an element temperature of 30° C. was 1:1.1:1.3.

The spectrum, the various color rendering properties, and the color of light emitted from the organic electroluminescent element 1 at an element temperature of 0 to 60° C. were measured using a spectral radiance meter (CS-2000), and the obtained results were as follows.

Figure 13:
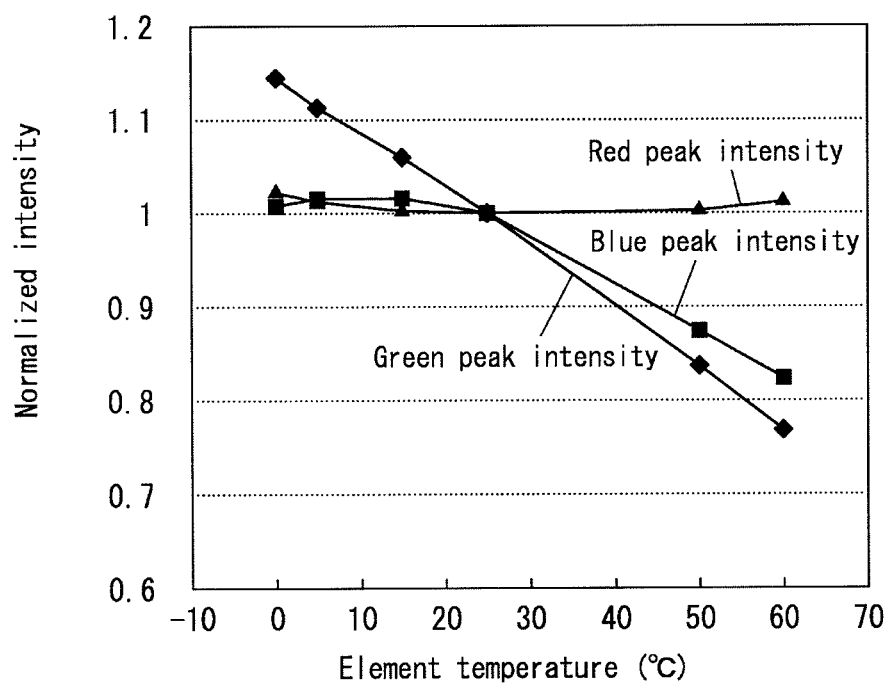
FIG. 13 is a graph showing the temperature dependency of intensities of peaks of blue, green, and red in the emission spectrum of light emitted from the organic electroluminescent element in the third example.

FIG. 13 shows relative values (normalized such that the intensity at 25° C. is equal to 1) of intensities of the peaks of blue (450 nm): green (563 nm): red (623 nm) in the emission spectrum of light emitted from the organic electroluminescent element 1 at various element temperatures. When the element temperature increases, the intensity of the peak of green changes the most, and decreases the most at a high temperature.

As shown in TABLE 3, the general color rendering index Ra has a high value of 85 or greater in a wide element temperature range of 5° C. to 60° C. This is realized by the organic electroluminescent element 1 according to the present example including the fluorescent first green region light emitting layer 22 and the phosphorescent second green region light emitting layer 24, and by utilizing the temperature dependencies of these emission intensities. The general color rendering index Ra has a peak at the element temperature of 25° C., and the value of the general color rendering index Ra is significantly high. The difference between the maximum and the minimum of the general color rendering index Ra is small in the range of the element temperature of 5° C. to 60° C., and the absolute value of the general color rendering index Ra is 90.1 (5° C.) at the lowest, and stable and high color rendering properties are obtained.

Both the color rendering index R8 (reddish purple) and the special color rendering index R9 (red) are increased with an increase in the element temperature, and they are maximized at 60° C. in the range of measurement. In other words, the general color rendering index Ra is high at room temperature, and accordingly R9 is high at a high temperature.

Both the special color rendering indexes R14 and R15 are slightly decreased at a high temperature. Although R9 is maximized at an element temperature of 60° C., the absolute value thereof is lower than R14 and R15. If the element is designed to slightly suppress R14 and R15 at a high temperature in this manner, effects of emphasizing red of R9 increase at an element temperature of 60° C., and effects of psychologically adding warmth to food are obtained.

TABLE 3

| | | Element temperature | | | | | | | |
|---|---|---|---|---|---|---|---|---|---|
| | | 0° C. | 5° C. | 10° C. | 15° C. | 20° C. | 30° C. | 50° C. | 60° C. |
| General color rendering index | Ra | 89.1 | 90.1 | 91.1 | 91.9 | 92.9 | 94.1 | 93.4 | 91.6 |
| Color rendering index | R8 | 77.6 | 79.1 | 80.7 | 82.0 | 83.7 | 86.5 | 91.7 | 93.7 |
| Special color rendering index | R9 | 46.6 | 50.8 | 55.2 | 58.9 | 64.0 | 72.3 | 88.6 | 94.9 |
| | R14 | 98.9 | 99.0 | 99.1 | 99.1 | 99.1 | 99.0 | 98.7 | 98.3 |
| | R15 | 84.8 | 86.2 | 87.7 | 88.9 | 90.7 | 93.5 | 95.0 | 91.9 |

TABLE 2 shows the chromaticity u' and v' and color temperatures in the cases where the element temperature is 25° C. and 60° C. in the element according to the present example.

TABLE 4

| | | Chromaticity u' | Chromaticity v' | Color temperature (K) |
|---|---|---|---|---|
| Element temperature | 25° C. | 0.221 | 0.505 | 4110 |
| | 60° C. | 0.234 | 0.503 | 3660 |

This shows that when the element temperature is increased up to 60° C., u' is increased and v' is decreased and that the color temperature is decreased at a high temperature. Hence, the element according to the present example is enabled to emit light having warmth with lowered power at a high temperature.

As obvious from the above, with using the organic electroluminescent 1 element of the present example, it is possible to realize a high general color rendering index Ra suitable for indoor lighting at room temperature. Also, the same element can be used for the purpose of improving the appearance of foods and dishes in a high temperature environment. In other words, it is possible to obtain effects that the element can be used in common, and development cost can be reduced, and therefore the production cost can be reduced and the standardization of lighting apparatuses can be promoted.

Third Example

The first electrode 15 was formed by forming ITO into a film having a thickness of 130 nm on the glass substrate 14. Furthermore, a hole injection layer made of PEDOT/PSS and having a thickness of 35 nm was formed on the first electrode 15 with a wet method. Subsequently, the hole transport layer 3, the blue region light emitting layer 22 (fluorescence), the first green region light emitting layer 22 (fluorescence), and the electron transport layer 4 were successively formed so as to each have a thickness of 5 nm to 60 nm, with a vapor deposition method. Next, the interlayer 13 having a layer structure of Alq3/Li$_2$O/Alg3/HAT-CN6 was placed thereon with a layer thickness of 15 nm. Next, the hole transport layer 3, the red region light emitting layer 23 (phosphorescence), the second green region light emitting layer 24 (phosphorescence), and the electron transport layer 4 were successively formed so that each layer has a maximum film thickness of 50 nm. Subsequently, an electron injection layer constituted by a Li film and the second electrode 16 constituted by an Al film were successively formed. The thickness of the red region light emitting layer 23 was 2 nm, and the thickness of the second green region light emitting layer 24 was 40 nm. With this process, the organic electroluminescent element 1 was prepared.

Figure 14:
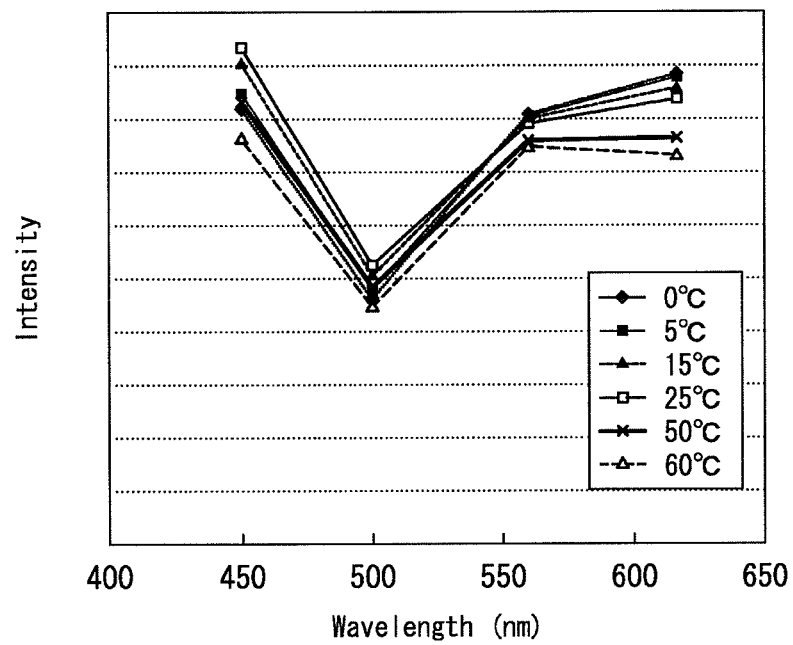
FIG. 14 is a graph showing change with temperature in emission intensity for an organic electroluminescent element in the second example of the present invention at wavelengths of 450 nm corresponding to a peak position of a color matching function X, 560 nm corresponding to a peak position of a color matching function Y, 616 nm corresponding to a peak position of a color matching function Z, and 500 nm corresponding to a valley position located between the peaks.

FIG. 14 shows the changes with temperature in the emission intensities of the organic electroluminescent element 1 at wavelengths of 450 nm corresponding to the peak position of the color matching function X, 560 nm corresponding to the peak position of the color matching function Y, 616 nm corresponding to the peak position of the color matching function Z, and 500 nm corresponding to the valley position between the peaks in XYZ color matching functions that are important for color rendering properties.

The peak intensity proportion of blue (450 nm): green (563 nm): red (623 nm) in the emission spectrum of light emitted from the organic electroluminescent element 1 at an element temperature of 30° C. was 1:0.8:0.9.

The spectrum, the various color rendering properties, and the color of light emitted from the organic electroluminescent element 1 at an element temperature of 0 to 60° C. were measured using a spectral radiance meter (CS-2000), and the obtained results were as follows.

Figure 15:
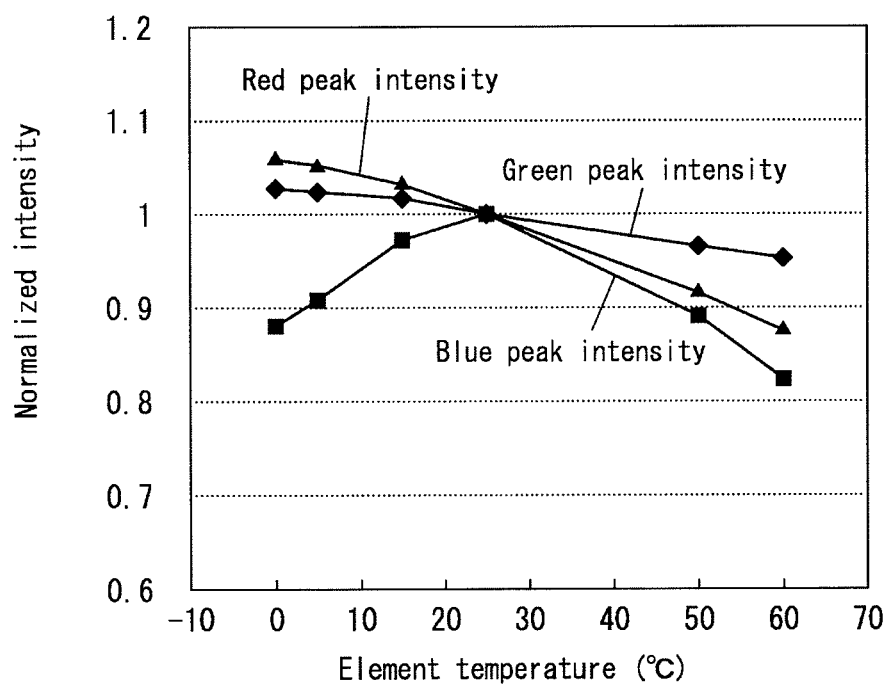
FIG. 15 is a graph showing the temperature dependency of intensities of peaks of blue, green, and red in the emission spectrum of light emitted from the organic electroluminescent element in the third example.

FIG. 15 shows relative values (normalized such that the intensity at 25° C. is equal to 1) of intensities of the peaks of blue (450 nm): green (563 nm): red (623 nm) in the emission spectrum of light emitted from the organic electroluminescent element 1 at various element temperatures. When the element temperature increases, the intensity of the peak of red changes the most, and decreases the most at a high temperature.

As shown in TABLE 5, the general color rendering index Ra has a high value in a wide range. This is realized by the organic electroluminescent element 1 according to the present example including the fluorescent blue region light emitting layer 21, the fluorescent first green region light emitting layer 22, the phosphorescent red region light emitting layer 23 and the phosphorescent second green region light emitting layer 24, and by utilizing the temperature dependencies of these emission intensities.

Further, with regard to the range of the element temperature of 0° C. to 60° C., the special color rendering index R8, the special color rendering index R9, the special color rendering index R14, and the special color rendering index R15 have their maxima in the range of the element temperature of 10° C. to 300.

Further, in the element temperature range of 0° C. to 30° C., each of the general color rendering index Ra, the special color rendering index R8, the special color rendering index R14, and the special color rendering index R15 satisfies a condition that a proportion of its minimum to its maximum is equal to 0.8 or more and a value thereof is equal to 70 or more.

Further, in the element temperature range of 0° C. to 30° C., the special color rendering index R9 has a proportion of its minimum to its maximum that is equal to 0.75 or more, and has its value that is equal to 40 or more.

TABLE 5

| | | \multicolumn{8}{c}{Element temperature} |
|---|---|---|---|---|---|---|---|---|---|
| | | 0° C. | 5° C. | 10° C. | 15° C. | 20° C. | 30° C. | 50° C. | 60° C. |
| General color rendering index | Ra | 90.3 | 90.6 | 90.8 | 90.9 | 90.9 | 90.7 | 89.1 | 87.6 |
| Color rendering index | R8 | 79.5 | 80.1 | 80.6 | 81.1 | 81.3 | 87.7 | 77.9 | 75.6 |
| Special color rendering index | R9 | 53.0 | 55.1 | 57.0 | 58.8 | 60.0 | 59.2 | 47.8 | 39.7 |
| | R14 | 98.8 | 99.0 | 99.1 | 99.0 | 98.9 | 98.7 | 98.7 | 98.4 |
| | R15 | 89.4 | 90.0 | 90.5 | 90.8 | 90.9 | 90.5 | 86.8 | 84.0 |

TABLE 6 shows the chromaticity u' and v' and color temperatures in the cases where the element temperature is 0° C. and 25° C. in the element according to the present example.

TABLE 6

| | | Chromaticity u' | Chromaticity v' | Color temperature (K) |
|---|---|---|---|---|
| Element temperature | 0° C. | 0.218 | 0.496 | 4400 |
| | 25° C. | 0.213 | 0.488 | 4800 |

This result shows that the values of u' and v' are greater in the case where the element temperature is 0° C. than in a case where the element temperature is 25° C. and the color temperature of light is lower in the case where the element temperature is 0° C. than in the case where the element temperature is 25° C.

REFERENCE SIGNS LIST

1 Organic electroluminescent element
2 Light emitting layer
3 Lighting fixture

The invention claimed is:

1. An organic electroluminescent element, comprising:
    a first light emitting layer, including a first green region light emitting layer;
    a second light emitting layer, including a second green region light emitting layer; and
    an interlayer interposed between the first light emitting layer and the second light emitting layer,
    the organic electroluminescent element having such characteristics that:
    an element temperature, at which a general color rendering index Ra has its maximum in an element temperature range of 5° C. to 60° C., is present in a range of 15° C. to 35° C.; and,
    an element temperature, at which at least one of a color rendering index R8, a special color rendering index R9, a special color rendering index R14, and a special color rendering index R15 has its maximum in the element temperature range of 5° C. to 60° C., is in a temperature range higher than the element temperature at which the general color rendering index Ra has its maximum.

2. The organic electroluminescent element according to claim 1, wherein,
    in the element temperature range from the element temperature at which the general rendering index Ra has its maximum to 60° C., at least one of the color rendering index R8, the special color rendering index R9, the special color rendering index R14, and the special color rendering index R15 increases with an increase in the element temperature.

3. The organic electroluminescent element according to claim 1, wherein,
    in the element temperature range from the element temperature at which the general rendering index Ra has its maximum to 60° C., at least one of the color rendering index R8 and the special color rendering index R9 increases with an increase in the element temperature.

4. The organic electroluminescent element according to claim 1, wherein
    a value of the special color rendering index R9 at the element temperature of 60° C. is in a range of 1.2 to 1.9 times a value of the special rendering index R9 at the element temperature of 25° C.

5. The organic electroluminescent element according to claim 1, wherein
    the element temperature at which at least one of the special color rendering indexes R14 and R15 has a maximum in the element temperature range of 5° C. to 60° C. falls within a range of 40° C. to 60° C.

6. The organic electroluminescent element according to claim 1, wherein,
    with regard to values of u' and v' in a u', v' chromaticity diagram of a color of light emitted from the organic electroluminescent element in a direction identical to a direction in which the first light emitting layer, the second light emitting layer and the interlayer are stacked, the value of u' increases more and the value of v' decreases more when the element temperature is 60° C. than when the element temperature is 25° C.

7. The organic electroluminescent element according to claim 1, wherein
    a color temperature of light is lower when the element temperature is 60° C. than when the element temperature is 25° C.

8. The organic electroluminescent element according to claim 1, wherein
    an applied voltage necessary for allowing current densities at the element temperatures of 60° C. and 25° C. to have the same value is lower when the element temperature is 60° C. than when the element temperature is 25° C.

9. The organic electroluminescent element according to claim 1, wherein,
    in the element temperature range of 0° C. to 60° C., at least one of the special color rendering index R8, the special color rendering index R9, the special color rendering index R14, and the special color rendering index R15 has its maximum in a range of the element temperature of 10° C. to 30° C.

10. The organic electroluminescent element according to claim 9, wherein,
    in the element temperature range of 0° C. to 30° C., at least one of the general color rendering index Ra, the special color rendering index R8, the special color rendering index R14, and the special color rendering index R15 is equal to 70 or more, and satisfies a condition that a ratio of a minimum to a maximum is equal to 0.8 or more.

11. The organic electroluminescent element according to claim 10, wherein,
    in the element temperature range of 0° C. to 30° C., the special color rendering index R9 is equal to 40 or more, and has a ratio of a minimum to a maximum that is equal to 0.75 or more.

12. The organic electroluminescent element according to claim 1, wherein,
    with regard to values of u' and v' in a u', v' chromaticity diagram of a color of light emitted from the organic electroluminescent element in a direction identical to a direction in which the first light emitting layer, the second light emitting layer and the interlayer are stacked, the values of u' and v' are greater when the element temperature is 0° C. than when the element temperature is 25° C.

13. The organic electroluminescent element according to claim 1, wherein
    a color temperature of light is lower when the element temperature is 0° C. than when the element temperature is 25° C.

14. The organic electroluminescent element according to claim 1,
    wherein at least one of the first green region light emitting layer and the second green region light emitting layer contains a phosphorescent dopant.

15. The organic electroluminescent element according to claim 1, wherein
    the first light emitting a red region light emitting layer,
    the red region light emitting layer and the first green region light emitting layer, containing a phosphorescent dopant, are stacked, and
    wherein the red region light emitting layer has a thickness less than a thickness of the first green region light emitting layer.

16. The organic electroluminescent element according to claim 15, wherein
    a ratio of the thickness of the red region light emitting layer to the thickness of the first green region light emitting layer is in a range of 2 to 15%.

17. The organic electroluminescent element according to claim 1, further comprising:
- a first light emitting unit including the first light emitting layer; and
- a second light emitting; unit including the second light emitting layer,
- wherein the interlayer is interposed between the first light emitting unit and the second light emitting unit.

18. A lighting fixture comprising the organic electroluminescent element according to claim 1.

19. A food storage device, comprising:
- a storage configured to store food; and
- the lighting fixture according to claim 18 configured to illuminate an interior of the storage.

20. The organic electroluminescent element according to claim 1, wherein
- the interlayer provides at least one of an equipotential surface and a charge generation layer.

* * * * *